(12) United States Patent
Schaefer et al.

(10) Patent No.: US 12,046,316 B2
(45) Date of Patent: Jul. 23, 2024

(54) TECHNIQUES FOR DETECTING A STATE OF A BUS

(71) Applicant: Micron Technology, Inc., Boise, ID (US)

(72) Inventors: Scott E. Schaefer, Boise, ID (US); Aaron P. Boehm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 17/502,982

(22) Filed: Oct. 15, 2021

(65) Prior Publication Data

US 2022/0139487 A1     May 5, 2022

Related U.S. Application Data

(60) Provisional application No. 63/106,955, filed on Oct. 29, 2020.

(51) Int. Cl.

| | |
|---|---|
| *G11C 8/18* | (2006.01) |
| *G11C 29/12* | (2006.01) |
| *G11C 29/14* | (2006.01) |
| *G11C 29/42* | (2006.01) |

(52) U.S. Cl.
CPC ............... *G11C 29/42* (2013.01); *G11C 8/18* (2013.01); *G11C 29/12005* (2013.01); *G11C 29/14* (2013.01); *G11C 2029/1208* (2013.01)

(58) Field of Classification Search
CPC ..... G11C 29/42; G11C 8/18; G11C 29/12005; G11C 29/14; G11C 2029/1208; G11C 29/38; G11C 29/50012; G11C 29/022
See application file for complete search history.

(56) References Cited

U.S. PATENT DOCUMENTS

| | | | |
|---|---|---|---|
| 5,938,773 A * | 8/1999 | Hauck ................. | H04L 25/4908 714/6.24 |
| 2007/0089044 A1* | 4/2007 | Goma ................... | H04L 1/0057 714/801 |
| 2010/0005365 A1* | 1/2010 | Buchmann ............ | H03M 13/13 714/758 |

\* cited by examiner

*Primary Examiner* — Mohammed A Bashar
(74) *Attorney, Agent, or Firm* — Holland & Hart LLP

(57) ABSTRACT

Methods, systems, and devices for techniques for detecting a state of a bus are described. A memory device may fail to receive or decode (e.g., successfully receive or successfully decode) an access command transmitted to the memory device via a bus. The bus may enter or remain in an idle state which may cause indeterminate signals to develop on the idle bus. A host device may obtain the indeterminate signals from the idle bus and determine that the indeterminate signals include an error based on a signal that develops on a control line of the idle bus. The signal may be associated with a control signal that indicates errors in a data signal when the control signal has a first voltage, and the control line may be configured to have the first voltage when the bus is idle.

33 Claims, 9 Drawing Sheets

TECHNIQUES FOR DETECTING A STATE OF A BUS

CROSS REFERENCE

The present application for patent claims the benefit of U.S. Provisional Patent Application No. 63/106,955 by SCHAEFER et al., entitled "TECHNIQUES FOR DETECTING A STATE OF A BUS," filed Oct. 29, 2020, assigned to the assignee hereof, and expressly incorporated by reference herein.

FIELD OF TECHNOLOGY

The following relates generally to one or more systems for memory and more specifically to techniques for detecting a state of a bus.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
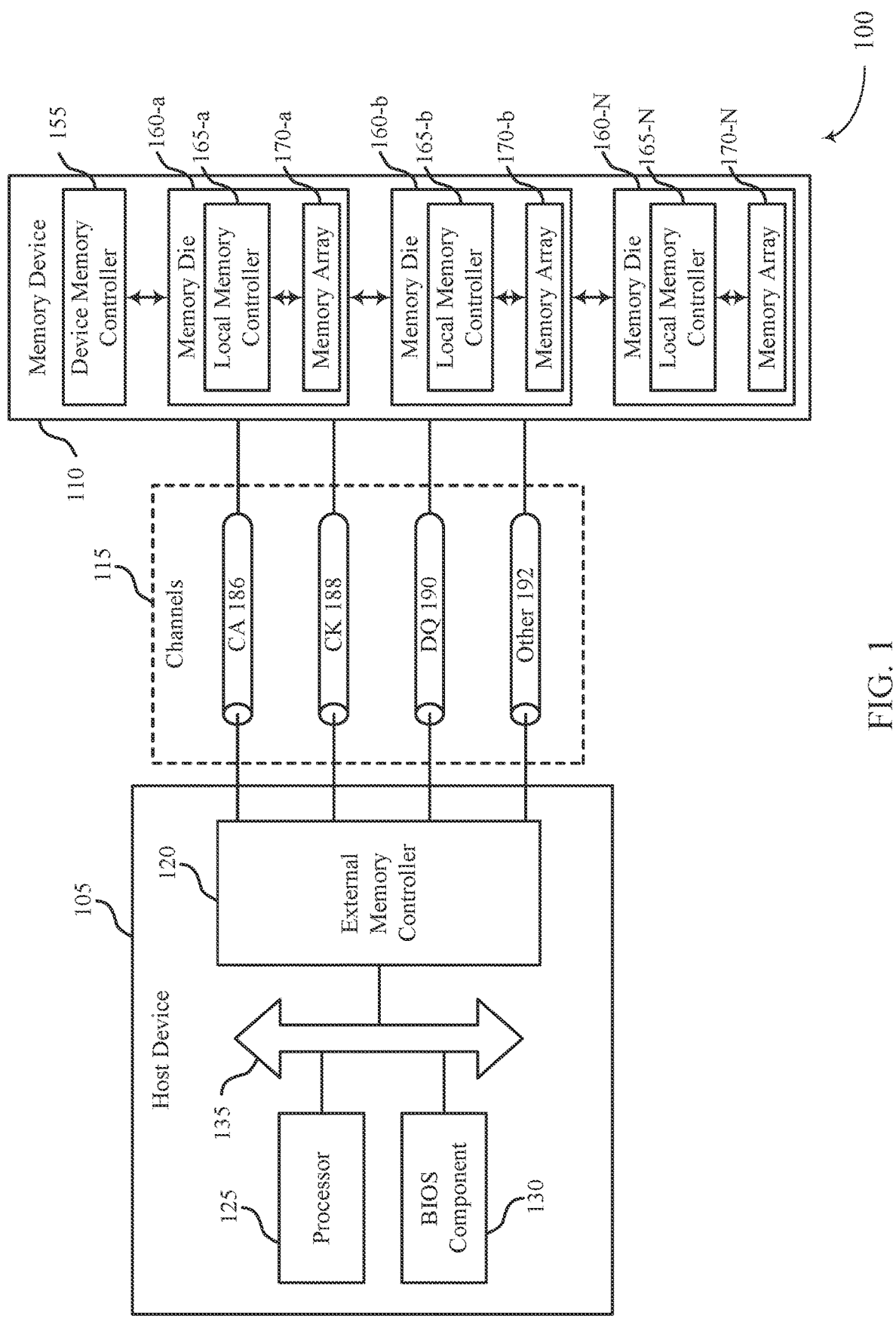
FIG. 1 illustrates an example of a system that supports techniques for detecting a state of a bus in accordance with examples as disclosed herein.

A system may include a memory device and a host device, which may communicate with one another using a bus. Different packages (e.g., packages that vary in size, density, architecture, other aspects, or any combination thereof) may be used to contain a memory device. A package that contains a memory device may include multiple pins that are coupled with the bus and provide access to and from components within the memory device. In some examples, one or more of the pins may be coupled with data lines of the bus and one or more of the pins may be coupled with control lines of the bus.

In some examples, the system (e.g., the host device, the memory device, both the host device and the memory device together) may be configured to satisfy a failure rate metric. For example, the system may be configured so that a quantity of failures that is expected to occur in one billion hours of operation for the system (which may also be referred to as a Failures in Time (FIT) rate) is below a threshold. In the context of memory operations, a failure may include an instance when a host device uses erroneous or invalid data obtained from the memory device to perform an operation—e.g., to steer a vehicle. To meet the failure rate metric, the system may employ data-reliability techniques that reduce such failures by enabling the host device to detect, correct, or discard erroneous or invalid data, or any combination thereof. One such technique may include generating a signal, such as a syndrome check signal, that indicates to a host device whether there is an error in a second signal, such as a corresponding data signal, where the signal may be transmitted, for example, over a control line of the bus and the second signal may be transmitted, for example, over one or more data lines of the bus.

A failure rate of a system may be affected by a type of packaging used for a memory device—e.g., a failure rate may increase as a footprint of the packaging decreases, a density of the packaging increases, or both, among other relationships or conditions. In some examples, changing a package (e.g., from a first package to a second package) used to contain a memory device may cause the FIT rate for a system that previously satisfied a FIT rate threshold when the memory device was packaged in the first package to exceed the FIT rate threshold when the memory device is packaged in a second package (e.g., a current package). In some examples, packaging errors that cause a bus between the memory device and host device to improperly enter or remain in a floating state cause the FIT rate to exceed a threshold. In such cases, the host device may be unable to determine whether a signal on the bus is a data signal driven by the memory device (which may also be referred to as a valid data signal) or an indeterminate (e.g., random, unknown, invalid) data signal that may result on the bus when the bus is in a floating state. Also, in some examples, the host device may improperly determine that the indeterminate data signal on the bus is a valid data signal and use invalid data obtained from the indeterminate data signal to perform an operation, increasing a FIT rate for the system, among other disadvantages.

To reduce a FIT rate of a system caused by packaging failures, a memory device may configure an existing control signal to indicate one or more errors in a corresponding data signal when a bus that connects the memory device and a host device is in an idle state (e.g., a floating state). Thus, a host device may, in some examples, discard data obtained from a purported data signal (e.g., an indeterminate data signal) that develops on an idle or floating bus after determining that the purported data signal includes one or more uncorrectable errors. In some examples, a control signal (e.g., a syndrome check signal) used to indicate whether a corresponding data signal includes one or more errors may be modified to indicate that the corresponding data signal includes one or more errors when the bus is idle, for example, by inverting the control signal. In such cases, the modified control signal may be configured so that a voltage of the modified control signal when a corresponding data signal includes one or more errors is consistent with a voltage of a control line used to convey the modified control signal when the bus is floating.

Features of the disclosure are initially described in the context of systems and dies. Features of the disclosure are described in the context of a timing diagram and process flow. These and other features of the disclosure are further illustrated by and described with reference to an apparatus diagram and flowcharts that relate to techniques for detecting a state of a bus.

FIG. 1 illustrates an example of a system 100 that supports techniques for detecting a state of a bus in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

To reduce a FIT rate of a system caused by packaging failures, a memory device 110 may configure a control signal to indicate one or more errors in a corresponding data signal when a bus that connects the memory device 110 and a host device 105 is in an idle state (e.g., a floating state). Thus, a host device 105 may, in some examples, discard data obtained from a purported data signal (e.g., an indeterminate data signal) that develops on an idle or floating bus after determining that the purported data signal includes one or more uncorrectable errors. In some examples, a control signal (e.g., a syndrome check signal) used to indicate whether a corresponding data signal includes one or more errors may be modified to indicate that the corresponding data signal includes one or more errors when the bus is idle—e.g., by inverting the control signal. In such cases, the modified control signal may be configured so that a voltage of the modified control signal when a corresponding data signal includes one or more errors is consistent with a voltage of a control line used to convey the modified control signal when the bus is floating.

Figure 2:
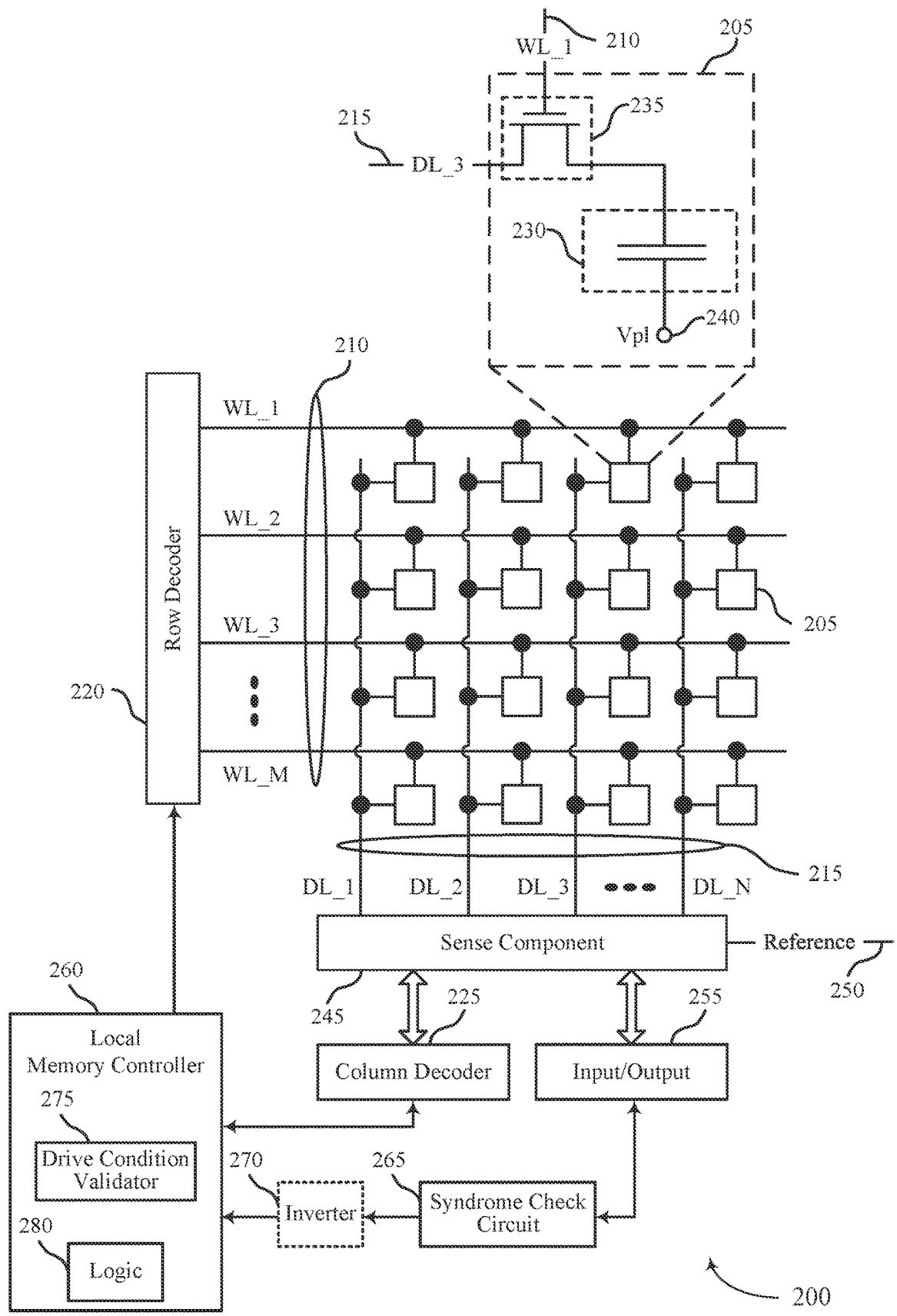
FIG. 2 illustrates an example of a memory die that supports techniques for detecting a state of a bus in accordance with examples as disclosed herein.

FIG. 2 illustrates an example of a memory die 200 that supports techniques for detecting a state of a bus in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

A package may be used to contain and provide access to and from a memory device, such as the memory device 110 in FIG. 1, which may include a memory die 200. The package may include pins that give access to and from components within the memory device 110, such as the memory die 200. For example, a memory controller (e.g., a device memory controller 155 in FIG. 1, a local memory controller 165 in FIG. 1, the memory controller 260) in the memory device may be coupled with a set of DQ pins that allow data to be inputted to or outputted from the memory controller. The package may also include a read data strobe (RDQS) pin that is used by the memory controller to output a clock signal (which may also be referred to as an RDQS signal) for sampling a data signal on the DQ pins—e.g., when the memory device is configured to operate using a frequency that falls within a range of frequencies. Also, the package may include a data mask inversion (DMI) pin that is used to output error management information—e.g., information for detecting and/or correcting errors.

The pins of the package may also be coupled with a bus (or transmission bus) that includes lines (or transmission lines). The bus may be used to provide a communicative path between the memory device and a host device (e.g., host device 105 of FIG. 1). The transmission lines of the bus may include data lines and control lines. In some examples, the DQ pins may be coupled with data lines of the bus, the RDQS pin may be coupled with a control (or clock) line of the bus, and the DMI pin may be coupled with a control line of the bus. In some examples, the pins of the package and/or the transmission lines of the bus may be terminated (e.g., weakly) to a voltage source or voltage sink (e.g., a ground reference). Thus, when the bus is not being used (e.g., is in an idle, inactive, or floating state), the voltage of the pins and transmission lines may trend toward the voltage of the voltage source or voltage sink. Alternatively, when the bus is being used (e.g., is in an active state) by either the memory device or the host device, the voltage of the transmission lines may be driven by the memory device or the host device.

A failure rate for a system (e.g., system 100) that includes a host device and memory device may be determined by testing multiple similarly-constructed systems for a time interval and determining a quantity of failures that occur per aggregate hour—e.g., if one hundred systems are tested for one hundred hours, the failure rate may determine a quantity of failures that occur in around 10,000 hours. A failure may include a scenario where a host device receives invalid data from a memory device without determining that the data is invalid—in such cases, the host device may use the invalid data to perform an operation. In some examples, the testing may yield a quantity of failures expected to occur in one billion hours of operation for the system, which may also be referred to as a FIT rate. The system may be configured to have an acceptable FIT rate—e.g., a FIT rate that is below a threshold. In some examples, the threshold is set based on the ramifications of a failure. For example, the more severe an injury that may result from a failure, the stricter the FIT rate may be—e.g., the threshold value may be lower (e.g., less than 4 FITs) if the system is deployed in an application used to operate an automobile (e.g., in an autonomous vehicle).

A system may employ data-reliability techniques to achieve an acceptable FIT rate. For example, the system may store parity bits with data, where the parity bits may be used to identify and/or correct errors in the data when the data is output to a host device. In some examples, the parity bits may be used to generate one or more syndrome bits that indicate which bits in a data packet are defective. In some examples, a memory device may include a syndrome check circuit 265 that generates a syndrome check signal that enables a host device to quickly identify whether received data includes one or more errors. The syndrome check circuit 265 may check syndrome bits associated with a set of data and generate an indication (which may be referred to as the syndrome check signal) for a host device that indicates whether there is in an error in the data—e.g., if the syndrome bits include any non-zero syndrome bits. The syndrome check circuit 265 may also be configured to indicate additional information such as a quantity of errors, phantom errors, a type of error, and the like. In some examples, the memory device also signals the syndrome bits used to generate the syndrome check signal to the host device—the host device may use the syndrome bits to detect and/or correct one or more errors in the received data. A host device may use the information to avoid failures that would otherwise contribute to the FIT rate.

In some examples, the syndrome check circuit 265 is configured to output a first voltage (e.g., a low voltage) for the syndrome check signal that represents a first logic value (e.g., logic value "0") when no errors are detected from the syndrome bits. The syndrome check circuit 265 may obtain the first logic value by applying a logical OR operation to the syndrome bits, where each of the syndrome bits may have the first logic value. The syndrome check circuit 265 may also be configured to output a second voltage (e.g., a high voltage) for the syndrome check signal that represents a second logic value (e.g., logic value "1") when one or more errors are detected from the syndrome bits. The syndrome check circuit 265 may obtain the second logic value by applying a logical OR operation to the syndrome bits, where one or more of the syndrome bits have the second logic value. In some examples, to decrease the possibility of improperly generating the syndrome check signal, the syndrome check circuit 265 may use multiple paths to generate the syndrome check signal and output the syndrome check signal that is generated by a majority of the paths (which may be referred to as using triple modular redundancy).

In some examples, the memory die 200 may also include a master error circuit to improve a reliability of data transfer. The master error circuit may enable a memory device to identify errors caused by the memory controller. For example, the master error circuit may identify errors that occur when a memory device writes different data to memory than what is received or outputs different data to a host device than what is stored in memory—e.g., by accessing an incorrect row when writing to or reading from memory. In some examples, the syndrome check signal generated by the syndrome check circuit 265, a syndrome bit signal including the syndrome bits, the master error status signal generated by the master error circuit, or any combination thereof, may be outputted on the DMI pin. The memory device may include a multiplexer that may be used to switch from the syndrome check signal to the master error status signal to the syndrome bit signal. In some examples, during a first unit interval of a read operation, no signal is outputted on the DMI pin; during a next set of unit intervals of the read operation, the syndrome check signal is outputted on the DMI pin; during a following set of unit intervals of the read operation, the master error status signal is outputted on the DMI pin; and during a subsequent set of unit intervals of the read operation, the syndrome bit signal is outputted on the DMI pin.

In some examples, the unit intervals are determined based on a read clock signal outputted on the RDQS pin, where each unit interval corresponds to the duration between a falling edge of the read clock and a subsequent rising edge of the read clock. The read clock may be aligned with the outputting of data packets on the DQ pins. In some examples, the read clock is output by the memory device when the memory device is operated within a particular frequency range. When operating outside of the frequency range, the memory device may not output the read clock signal. In such cases, the unit intervals may be determined based on a write clock signal generated at the host device. In some examples, the RDQS signal may be generated using differential signals that correspond to a write clock signal received from the host device—e.g., an inverted and non-inverted version of the write clock signal (which may be referred to as a differential strobe technique). In other examples, the RDQS signal may be generated using the non-inverted version of a write clock signal received from the host device (which may be referred to as a single-ended strobe technique).

A failure rate of a system may be affected by a type of packaging used for a memory device—e.g., a failure rate may increase as a footprint of the packaging decreases or a density of the packaging is increased, or both, and vice versa. In some examples, changing a package used to contain a memory device may cause the FIT rate for a system that previously satisfied a FIT rate threshold when the memory device was packaged in a prior package to exceed the FIT rate threshold when the memory device is packaged in a current package—e.g., due to an increased quantity of mechanical failures that may occur, such as soldering failures or shorting scenarios. For example, packaging a memory device in a fine-pitch ball grid array may cause the FIT rate for the system to increase (e.g., to 25.5 FITs) relative to, for example, packaging the memory device in a ball grid array having a larger pitch (e.g., from 2.4 FITs).

In some examples, packaging errors that cause a bus between the memory device and host device to improperly enter or remain in a floating state significantly contribute to the increased FIT rate. In such cases, the host device may be unable to determine whether a signal on the bus is a data signal driven by the memory device (which may also be referred to as a valid data signal) or a random data signal that results on the bus when the bus is in a floating state (which may also be referred to as an invalid data signal). Also, in some examples, the host device may determine that a random data signal on the bus is a valid data signal and use invalid data obtained from the random data signal to perform an operation, increasing a FIT rate for the system.

To reduce a FIT rate of a system caused by packaging failures, a memory device may configure an existing control signal to indicate one or more errors in a corresponding data signal when a bus that connects the memory device and a host device is in an idle state (e.g., a floating state). Thus, a host device may, in some examples, discard data obtained from a purported data signal that develops on an idle or floating bus after determining that the purported data signal includes one or more uncorrectable errors.

In some examples, a control signal (e.g., a syndrome check signal) used to indicate whether a corresponding data signal includes one or more errors may be modified to indicate that the corresponding data signal includes one or more errors when the bus is idle—e.g., by inverting the control signal. In such cases, the modified control signal may be configured so that a voltage of the modified control signal when a corresponding data signal includes one or more errors is consistent with a voltage of a control line used to convey the modified control signal when the bus is floating. For example, if the bus is configured so that a control line used to convey a syndrome check signal has a low voltage when the bus is floating, the syndrome check signal may be modified so that when the syndrome check signal outputted by a memory device has a low voltage, the syndrome check signal indicates that a corresponding data signal includes one or more errors (instead of indicating no errors). And so that when the syndrome check signal outputted by a memory device has a high voltage, the syndrome check signal indicates that a corresponding data signal includes no errors (instead of indicating one or more errors).

In some examples, a host device may transmit a request for data to a memory device. In some examples, the memory device may fail to receive the request—e.g., if the memory device is in an idle state. In other examples, the memory device may receive, but fail to decode, the request—e.g., if a package used for the memory device is defective. In both cases, the memory device may not execute a sequence of operations used to retrieve and output the requested data to the host device, and the bus may enter or remain in an idle state (e.g., a floating state). Accordingly, a random pattern of voltages may develop on the data lines of the bus—e.g., as the voltage of the data line trends toward a voltage of a voltage source or voltage sink coupled with the data lines. Also, a voltage of a control line of the bus used to convey error signals may develop on the control line of the bus—e.g., the voltage of the control line may be at or near a voltage of a voltage source or voltage sink coupled with the control line. Without being informed that the memory device failed to receive and/or decode the request, the host device may sample the bus (e.g., in accordance with an internal write clock) as if the memory device had successfully decoded the request. Thus, the host device may obtain invalid data from a purported data signal on the data lines and may obtain a purported syndrome check signal from the control line.

Because the syndrome check signal is modified so that a voltage used to indicate one or more errors is consistent with a voltage of the control line when the bus is floating, the host device may determine that the purported syndrome check signal that develops on the floating control line indicates that the purported data signal that develops on the floating data lines includes one or more errors. Thus, the host device may attempt to detect and correct the one or more errors in the invalid data signal using the purported syndrome check signal (e.g., purported syndrome bits) that develop on the floating control line. In some examples, the host device may determine that the one or more errors in the invalid data are uncorrectable and discard the invalid data. By repurposing an existing control signal that is used to indicate one or more errors in a corresponding data signal to also indicate a state (e.g., an idle or active state) of the bus, a host device may discard invalid data obtained from a floating data bus and avoid errors that may occur if the host device were to otherwise use the invalid data, reducing a FIT rate for a memory system.

In some examples, syndrome check circuit 265 may be internally modified so that the output of syndrome check circuit 265 is inverted relative to the output of an unmodified version of syndrome check circuit 265—e.g., by inverting redundant paths in the syndrome check circuit 265. In some examples, memory die 200 may be configured to include inverter 270. Inverter 270 may be used to externally modify the output of the syndrome check circuit 265 by inverting the syndrome check signal generated by syndrome check circuit 265. In some examples, syndrome check circuit 265, inverter 270, or both may be included in memory controller 260.

In some examples, memory controller 260 may include drive condition validator 275. Drive condition validator 275 may be used to determine when a bus is being driven by a memory device. Drive condition validator 275 may generate a validation indicator based on an RDQS signal generated by the memory device—e.g., drive condition validator 275 may indicate the bus is being driven after detecting consecutive rising and falling edges for an RDQS signal. Memory controller 260 may also include logic 280. In some examples, the validation indication and the modified syndrome check output by syndrome check circuit 265 (or the inverted syndrome check output by inverter 270) may be applied to logic 280. Logic 280 may output a first logic value (e.g., "0") when one or both of the validation indicator and the syndrome check have the first logic value. Logic 280 may output a second logic value (e.g., "1") when both of the validation indicator and the syndrome check have the second logic value. In some examples, logic 280 may be an AND gate. Local memory controller may transmit the output of logic 280 over the DMI pin as the syndrome check signal and to indicate an error when there is an error in the data or the bus is in an idle state. By logically combining the validation indicator and the syndrome check used to generate the transmitted syndrome check signal, a reliability of the error indication may be increased.

Figure 3:
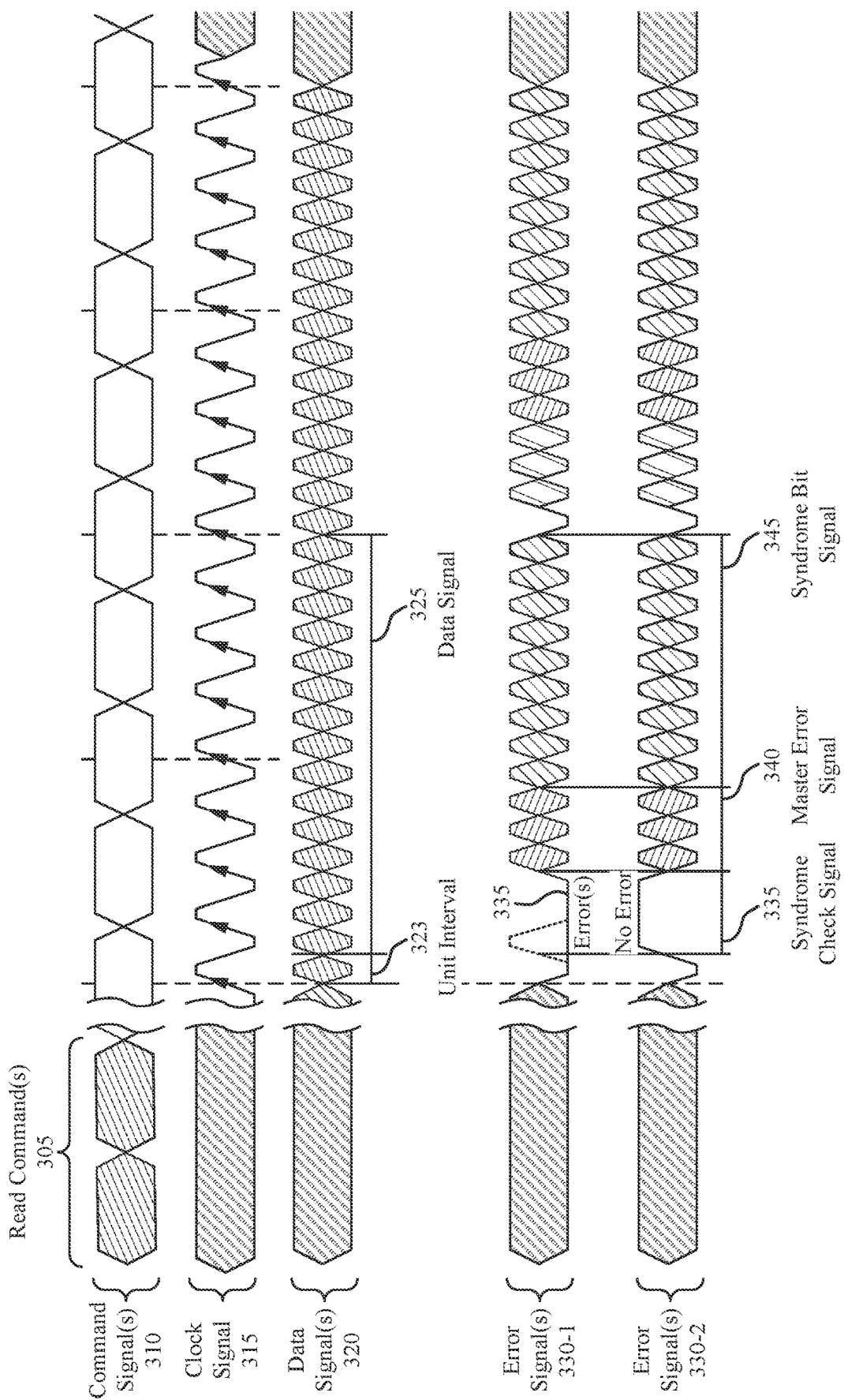
FIG. 3 illustrates an example of a timing diagram that supports techniques for detecting a state of a bus in accordance with examples as disclosed herein.

FIG. 3 illustrates an example of a timing diagram that supports techniques for detecting a state of a bus in accordance with examples as disclosed herein.

Timing diagram 300 depicts an exchange of signaling between a host device and a memory device, which may be example of a host device and memory device described in FIGS. 1 and 2. Timing diagram 300 may depict command signals 310 that may be transmitted over one or more command lines of a bus, clock signals 315 that may be transmitted over a clock line of the bus, data signals 320 that may be transmitted over one or more data lines of the bus, and error signals 330 that may be transmitted a control line of the bus.

In some examples, timing diagram 300 depicts an exemplary read operation between a host device and a memory device. To initiate the read operation, the host device may transmit, to the memory device via command lines, one or more read commands 305 requesting data stored in a memory array. After successfully receiving and/or decoding read commands 305, the memory device may initiate a sequence of operations for outputting the data requested by read commands 305. In such cases, the memory device may retrieve data and error management information (e.g., one or more parity bits) from one or more memory locations addressed by the one or more read commands.

The memory device may use the error management information to determine whether there are one or more errors in the data and to generate error management signaling (e.g., a syndrome bit signal, a syndrome check signal.) that may be used to detect and/or correct the one or more errors in the data.

In a first example, the memory device generates the syndrome check signal based on processing (e.g., OR'ing) the syndrome bits together, where one or more syndrome check bits having a zero logic value (e.g., "0", "00", "000") may result if no errors are identified in the data. And one or more syndrome check bits having a non-zero logic value (e.g., "1", "001", "010", "111") may result if one or more errors are identified in the data. The one or more syndrome check bits may be used to generate a syndrome check signal, where the generated syndrome check signal may have a consistently low voltage if the syndrome check bits indicate no errors in the data—e.g., if the syndrome check bits have a zero logic value. Or the generated syndrome check signal may have a consistently or intermittently high voltage if the syndrome check bits indicate one or more errors in the data—e.g., if the syndrome check bits have a non-zero logic value. In such examples, the generated syndrome check signal may be inverted to obtain syndrome check signal 335. By inverting the output of the generated syndrome check signal, the voltage of syndrome check signal 335 when there are one or more errors in the data may be consistent with a voltage of the control line when the bus is in an idle state (e.g., a floating state).

Alternatively, in a second example, a generated syndrome check signal may have a consistently or intermittently low voltage if the syndrome check bits indicate one or more errors in the data—e.g., if the syndrome check bits have a non-zero logic value. Or the generated syndrome check signal may have a consistently high voltage if the syndrome check bits indicate no errors in the data—e.g., if the syndrome check bits have a zero logic value. In such cases, the generated syndrome check signal may be consistent with syndrome check signal 335. In some examples, the memory device may invert the output of three different paths used to generate three redundant syndrome check signals that are used to obtain syndrome check signal 335 with an increased reliability. In both cases, syndrome check signal 335 may have a low voltage if the syndrome check bits indicate one or more errors in the data or a high voltage if the syndrome check bits indicate no errors in the data.

In some examples, the memory device may also generate a drive validation signal that indicates whether the bus is being driven by the memory device (that is, whether the bus is in the active state) based on receiving read commands 305. In some examples, the drive validation signal indicates that the bus is being driven by the memory device based on receiving the read commands 305. In some examples, the drive validation signal is generated based on the RDQS signal—e.g., the drive validation signal may indicate the bus is being driven after detecting consecutive rising and falling edges of the RDQS signal and/or based on a gating signal used to connect and isolate the RDQS signal from the bus. In some examples, the drive validation signal may be combined with the generated syndrome check signal in logic at the memory device—e.g., using a logical AND operator. The signal output by the logic may be consistent with syndrome check signal 335. In such cases, if either errors are identified in the data or the bus is not being driven, syndrome check signal 335 may have a low voltage. In some examples, the signal output by the logic is used to drive a voltage of the control line to the low voltage when the bus is in an idle state.

The memory device may output data signals 320 over data lines of the bus. Data signals 320 may include data stored in a memory array and requested by a host device. The memory device may also output clock signal 315 over a clock line of the bus, where clock signal 315 may be used to synchronize a sampling of the data lines at the host device with an output of subsets of the data from the memory device in data signals 320. In some examples, a new subset of the requested data is output on a rising edge of the read clock and a falling edge of the read clock. Each rising and falling edge of the read clock may be associated with a unit interval 323 of the data output operation. In some examples, the memory device may be limited to outputting clock signal 315 after being configured to operate within a frequency range (e.g., a high frequency range). When the memory device operates in a lower frequency range, the memory device may leave the clock line of the bus unused. In such cases, the host device may use an internal clock (e.g., a write clock) generated at the host device to sample the data and control lines of the bus.

The memory device may output one or more error signals 330 over the control line of the bus. Error signals 330 may be used to indicate one or more errors associated with corresponding data signals. In some examples, a signal on the control line during a first unit interval of the output operation may have a low voltage, and no information may be indicated during the first unit interval. In a next set of one or more unit intervals, the memory device may output syndrome check signal 335 over the control line. A voltage of syndrome check signal 335 may indicate whether data signal 325 includes no errors or one or more errors. In some examples, the voltage of syndrome check signal 335 may be maintained for three unit intervals. In such cases, syndrome check signal 335 may be used to indicate one or more errors by representing a logic value that includes a zero value (e.g., "0", "00", "000", "100", "110") or used to indicate no errors by representing a consistently non-zero logic value (e.g., "111").

FIG. 3 depicts alternative possibilities for the one or more error signals 330 transmitted over the control line. That is, FIG. 3 depicts a first possibility where one or more first error signals 330-1 indicate that the corresponding data signal 325 includes one or more errors. In such cases, syndrome check signal 335 may have a consistently low voltage (or an intermittently low voltage, e.g., as depicted by the dotted lines) to indicate that data signal 325 includes one or more errors—e.g., based on the control line being terminated (e.g., weakly) to the low voltage. FIG. 3 also depicts a second possibility where one or more second error signals 330-2 indicate that the corresponding data signal 325 includes no errors. In such cases, syndrome check signal 335 may have a consistently high voltage to indicate that data signal 325 includes no errors—e.g., based on the control line being terminated (e.g., weakly) to the low voltage.

Additionally, or alternatively, the memory device may output master error status signal 340 over the control line of the bus. Master error status signal 340 may be transmitted in a unit interval that occurs after an end of syndrome check signal 335 (e.g., in the fifth unit interval) and may be used to indicate whether an error associated with the memory controller occurred. In some examples, memory device generates a master error status signal with a low voltage (e.g., associated with a zero logic value, e.g., "0", "00", "000") when there are no master errors associated with data signal 325 and a high voltage (e.g., associated with a non-zero logic value, (e.g., "1", "001", "010", "111") when one or more master errors associated with data signal 325 occur. In some examples, in an additional or alternative option, a generated master error status signal may be inverted to obtain master error status signal 340, where master error status signal 340 may have a low voltage when one or more master errors associated with data signal 325 occur and a high voltage when no master errors associated with data signal 325 occur.

After transmitting master error status signal 340, the memory device may output syndrome bit signal 345, which may be used by the host device to detect, correct, and/or discard (if the errors are uncorrectable) data obtained in data signal 325. In some examples, the memory device switches between syndrome check signal 335, master error status signal 340, and syndrome bit signal 345 by modifying the output of a multiplexer that receives the three signals and is coupled with the control line used to convey the error management signals.

In some examples, in a prior or subsequent read operation, the host device may transmit another read command to the memory device, but the memory device may fail to receive or decode the read command. In some examples, the memory device may fail to receive the read command if the memory device is in an idle state when the read command is sent from the memory device. In some examples, the memory device may fail to decode the read command if a package used to contain the memory device is defective—e.g., if one of the connections used to convey the read command is broken or shorted. In both cases, the memory device may not identify the read command and, thus, may not initiate a sequence of operations for outputting the data requested by the read command. Accordingly, the bus may enter or remain in an idle state (e.g., a floating state). In some examples, if the bus is already in a floating state, which may be an example of an idle state, all or a majority of the data and control lines may be at or near a first voltage (e.g., a ground reference if the bus is terminated (e.g., weakly) to a ground reference). If the bus is entering the floating state, the voltages of the data and control lines may be indeterminate as the voltages of the data and control lines trend toward the ground reference. In some examples, the control line may be more strongly terminated to the ground reference to increase a speed at which the voltage of the control line reaches the ground reference when the bus is in a floating state. In either case, invalid data may develop on data lines of the bus. In some examples, the voltage of the clock line may also be indeterminate as the voltage of the clock line trends toward the ground reference.

In some examples, the memory device may generate a drive validation signal that indicates the bus is not being driven by the memory device based on failing to receive or decode the read commands 305. Thus, the memory device may drive a voltage of the control line used to indicate error management information to a low voltage.

After transmitting the read command and after a determined interval elapses, the host device may attempt to read a purported data signal (e.g., an indeterminate signal such as an indeterminate data signal) that has developed on the data lines and the purported error signals that have developed on the control line use to indicate error management information—e.g., in accordance with an write clock signal that is internal to the host device. In some examples, the host device may decode the purported data (which includes invalid data) and read a purported syndrome check signal that develops on the control line during an interval for communicating a syndrome check signal. The purported syndrome check signal may have a voltage (throughout or during one of the corresponding unit intervals) that is at or near a ground reference—e.g., based on the control line being terminated (e.g., weakly) to a ground reference. The host device may treat the purported syndrome check signal as a true syndrome check signal, and thus, the host device may determine that the data obtained from the purported data signal includes one or more errors—e.g., based on determining that the purported syndrome check signal has a low voltage (throughout or during one of the corresponding unit intervals).

After determining the purported data signal includes one or more errors, the host device may perform error detection/correction procedures—e.g., using a purported syndrome bit signal that develops on the control line during an interval for transmitting syndrome bits. In some examples, the host device may determine that the errors in the purported data signal are uncorrectable based on the purported syndrome bits. In some examples, the host device may determine that the errors in the purported data signal are uncorrectable if the purported syndrome signal is inconsistent with the purported syndrome check signal—e.g., if the purported syndrome check signal indicates one or more errors and the purported syndrome bit signal indicates no errors. Thus, the host device may discard the invalid data obtained from the purported data signal and avoid the occurrence of a failure. In some examples, after determining that there are one or more errors in the data signal, the host device may attempt to write a known pattern to the memory device and attempt to read the known pattern from the memory device to determine whether one or more components (e.g., a relevant memory die) in the memory device is defective—that is, the host device may determine a memory die is defective if a different pattern is output by the memory device relative to the pattern input by the host device.

In some examples, instead of inverting a generated syndrome check signal so that the inverted generated syndrome check signal has a voltage used to indicate one or more errors that is consistent with a voltage of the floating control line, the control line may be terminated (e.g., weakly) to a high voltage so that the voltage of the control line trends toward the high voltage when the bus is in the floating state.

Figure 4:
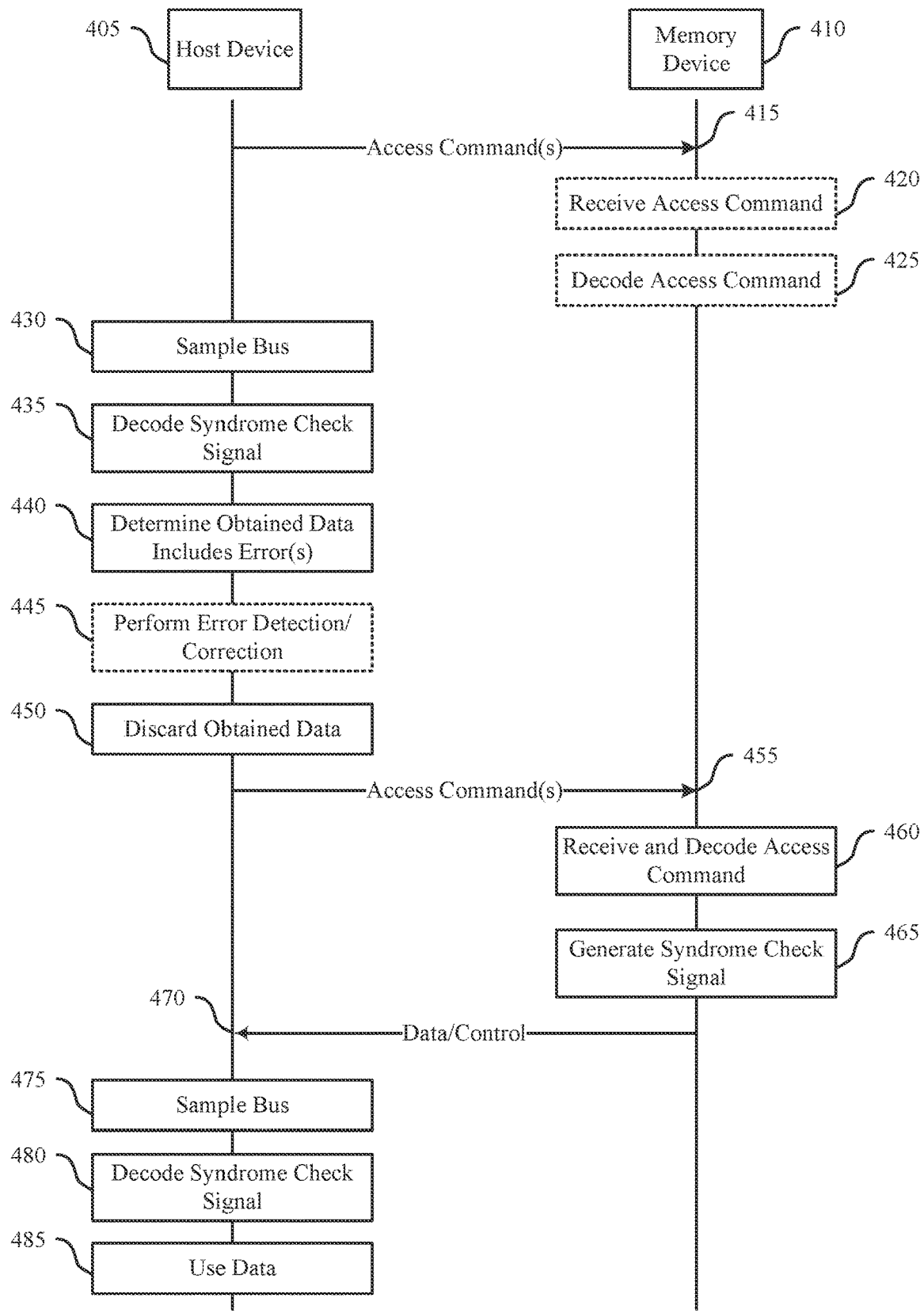
FIG. 4 illustrates an example of a process flow that supports techniques for detecting a state of a bus in accordance with examples as disclosed herein.

FIG. 4 illustrates an example of a process flow that supports techniques for detecting a state of a bus in accordance with examples as disclosed herein.

Process flow 400 may be performed by host device 405 and memory device 410, which may be examples of a host device or memory device described above with reference to FIGS. 1 and 2. In some examples, process flow 400 illustrates an exemplary sequence of operations performed to detect a state of a bus. For example, process flow 400 depicts operations for indicating a data signal includes one or more errors when a host device samples the data signal from a floating bus.

It is understood that one or more of the operations described in process flow 400 may be performed earlier or later in the process, omitted, replaced, supplemented, or performed in combination with another operation. Also, additional operations described herein that are not included in process flow 400 may be included.

At 415, host device 405 may transmit one or more access commands to memory device 410. The one or more access commands may include one or more read commands, one or more write commands, one or more other commands, or a combination thereof. In some examples, the one or more access commands include one or more read commands for requesting data stored in a memory array of memory device 410 and one or more memory addresses targeted by the one or more read commands.

At 420, memory device 410 may receive the one or more access commands. However, in some examples, memory device 410 may not receive the one or more access commands—e.g., if the memory device 410 is in an idle state (e.g., a floating state) when the one or more access commands are transmitted.

At 425, memory device 410 may decode the one or more access commands based at least in part on successfully receiving the one or more access commands. In some examples, memory device 410 may fail to successfully decode the one or more access commands—e.g., if a connection (e.g., a wire, trace, pin) within a package that contains the memory device and connects the command lines to the memory device is broken, shorted, or otherwise defective. If memory device 410 fails to receive and, in some examples, decode the one or more access commands, the memory device 410 may not perform a series of operations for executing the one or more access commands and the bus may enter or remain in an idle state (e.g., a floating state).

In some examples, memory device 410 generates a drive validation signal that indicates the bus is in an idle state based on failing to receive and/or decode the one or more access commands. The drive validation signal may be based on an RDQS signal or another signal associated with the bus being driven by memory device 410. The memory device may process (e.g., may apply) the drive validation signal to logic that receives the drive validation signal and a syndrome check signal. In such cases, the logic may output a low voltage (based on the drive validation signal having the low voltage) and may be used to drive a control line (e.g., a DMI line) to the low voltage while the bus is in the idle state.

At 430, host device 405 may sample the bus as if the memory device had executed the one or more access commands transmitted from host device 405. In some examples, in one or more unit intervals, if not each unit interval, of multiple unit intervals of a read operation, host device 405 may sample the data lines of the bus and control lines of the bus. In some examples, host device 405 samples the data lines based on a write clock signal generated at host device 405. In some examples, host device 405 samples the data lines based on noise on one or multiple RDQS lines that cause host device 405 to determine that data has been transmitted. In some examples, host device 405 may determine a logic value for each sampled signal to obtain data and control information. When memory device 410 fails to receive and, in some examples, decode the one or more access commands, the bus may be in an idle state, and thus, the data signal on the bus may include invalid data. In some examples, the data signal includes multiple signals which may be at or near a ground reference. In other examples, a subset of the multiple signals may be at or near a ground reference and a subset of the multiple signals may be near a high signaling voltage.

At 435, host device 405 may decode a syndrome check signal. Decoding the syndrome check signal may include sampling a control line of the bus in an interval in which the syndrome check signal is expected to be transmitted from memory device 410. When memory device 410 fails to receive and, in some examples, decode the one or more access commands, the bus may be in an idle state, and thus, the syndrome check signal on the bus may have a voltage associated with a floating state of the bus. In some examples, the syndrome check signal may have a voltage that is at or near a ground voltage—e.g., based on the control line being weakly terminated to a ground reference. As described in FIG. 3, the syndrome check signal may be generated so that when a voltage of the syndrome check signal matches (or nearly matches) a voltage of the floating control line, the syndrome check signal indicates that there is one or more errors in a corresponding data signal.

At 440, host device 405 may determine that the data obtained from the data signal on the bus includes one or more errors based on determining that the syndrome check signal has a voltage that indicates the data signal includes one or more errors.

At 445, host device 405 may perform an error detection and/or correction operation in an attempt to identify and, in some examples, correct errors in the data signal. In some examples, host device 405 may use a syndrome bit signal that occurs in unit intervals in which the syndrome bit signal is expected to be received from memory device 410. In some examples, host device 405 may use the syndrome bit signals in an attempt to identify and correct errors in the data signal but may determine that the errors in the data signal are uncorrectable. In other examples, host device 405 may determine that the syndrome check signal is inconsistent with the syndrome bits obtained from the syndrome bit signal—e.g., the syndrome check signal may indicate one or more errors in the data signal while the syndrome bits may indicate there are no errors in the data signal (e.g., if the syndrome bits are all zeros).

At 450, host device 405 may discard the invalid data obtained from the data signal on the floating data bus. In some examples, host device 405 discards the invalid data based on determining that the errors in the obtained data are uncorrectable. In some examples, host device 405 discards the invalid data based on determining that the syndrome check signal and syndrome bits are inconsistent with one another.

At 455, host device 405 may retransmit the one or more access commands for the data. In some examples, host device 405 retransmits the one or more access commands based on discarding the data obtained as a result of previously transmitting the one or more access commands.

At 460, memory device 410 may receive and decode the one or more access commands. In some examples, memory device 410 successfully receives and decodes the one or more access commands—e.g., if memory device 410 is no longer in an idle state or if a mechanical failure that prevented memory device 410 from decoding the one or more access commands the first time has resolved itself (e.g., temporarily).

At 465, memory device 410 may generate the syndrome check signal based on receiving and decoding the one or more access commands. In some examples, generating the syndrome check signal includes OR'ing together a set of syndrome bits generated for data targeted by a read command. In some examples, the generated syndrome check signal has a low voltage if the syndrome bits indicate no errors in the data (e.g., if all of the syndrome bits have zero values) and a high voltage if the syndrome bits indicate one or more errors in the data (e.g., if one or more of the syndrome bits has zero values). In such cases, the generated syndrome check signal may be inverted before being transmitted over the control line of the bus so that the transmitted syndrome check signal has a high voltage when there are no errors in the data and a low voltage when there are one or more errors in the data-so that a signal on the floating control line will also indicate there being one or more errors in a signal on the floating data lines. In such cases, the inverter may be included in a pre-driver circuit that is coupled with the control line.

Instead of inverting the generated syndrome check signal, components used to generate the syndrome check signal may be inverted during generation of the syndrome check signal. For example, if the syndrome check signal is generated by selecting the majority signal from three redundant paths that each generate a version of the syndrome check signal, an inverter may be included in each of the three redundant paths and the majority signal from the modified paths may be transmitted over the control line. That is, the inversion may be incorporated into the syndrome check signal generation rather (increasing a reliability of the inverted syndrome check signal) rather than inverting the syndrome check signal after it is generated.

In some examples, memory device 410 generates a drive validation signal that indicates the bus is in an active state based on decoding the one or more access commands. The memory device may apply the drive validation signal to logic that receives the drive validation signal and a syndrome check signal. In such cases, the logic may output a high voltage if both the drive validation signal and the syndrome check signal have a high voltage and may be used to drive a control line (e.g., a DMI line) to the high voltage while the bus is in the active state.

At 470, memory device 410 may transmit a data signal including the requested data and a control signal including the inverted syndrome check signal to the host device 405. The data signal may be transmitted over multiple data lines (e.g., DQ lines), and the syndrome check signal may be transmitted over a control line (e.g., DMI line). In some examples, a master error status signal and syndrome bits may also be transmitted over the control line. Memory device 410 may include a multiplexer that is used to pass the different signals to a signal driver that is coupled with the control line.

At 475, host device 405 may sample the bus as similarly described with reference to 430.

At 480, host device 405 may decode the syndrome check signal as similarly described with reference to 435. In some examples, host device 405 may determine that the corresponding data includes no errors if the syndrome check signal has a high voltage (e.g., that represents a logic value 1). In other examples, host device 405 may determine that the corresponding data includes one or more errors if the syndrome check signal has a low voltage (e.g., that represents a logic value 0).

At 485, host device 405 may use the data obtained from the data signal transmitted over the bus by memory device 410. In some examples, host device 405 may use the data obtained from the bus after determining from the syndrome check signal that the corresponding data includes no errors.

In other examples, host device 405 may use the data obtained from the bus after performing an error detection/correction operation after determining from the syndrome check signal that the corresponding data includes one or more errors. In such cases, host device 405 may use the syndrome bits obtained from a syndrome bit signal on the control line to detect and correct errors in the data obtained from the data signal. In some examples, host device may discard the data obtained from the data signal—e.g., based on determining that the corresponding data includes an uncorrectable quantity of errors (e.g., if the syndrome bits indicate there are two or more errors in the data).

Figure 5:
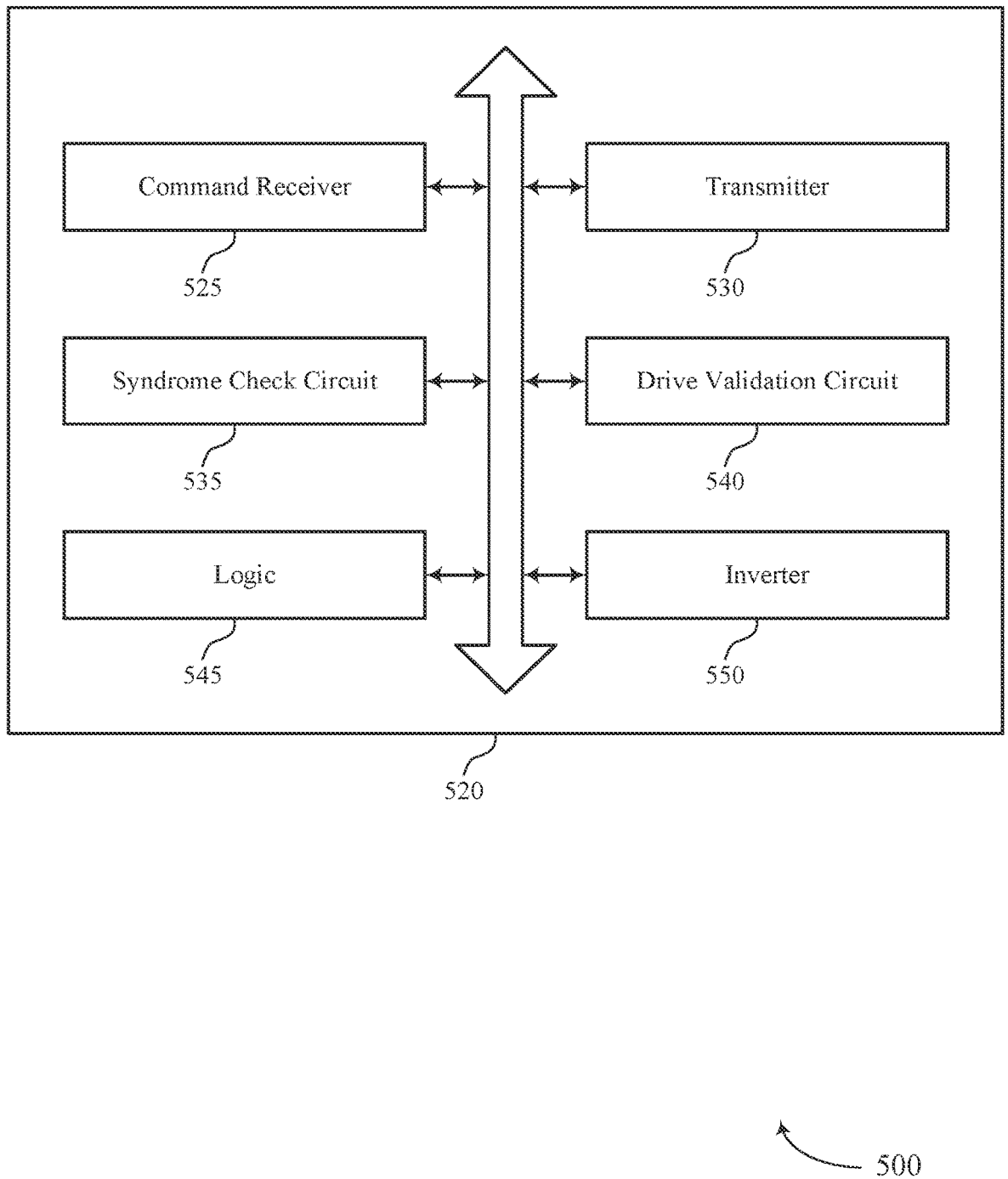
FIG. 5 shows a block diagram of a memory device that supports techniques for detecting a state of a bus in accordance with examples as disclosed herein.

FIG. 5 shows a block diagram 500 of a memory device 520 that supports techniques for detecting a state of a bus in accordance with examples as disclosed herein. The memory device 520 may be an example of aspects of a memory device as described with reference to FIGS. 1 through 4. The memory device 520, or various components thereof, may be an example of means for performing various aspects of techniques for detecting a state of a bus as described herein. For example, the memory device 520 may include a command receiver 525, a transmitter 530, a syndrome check circuit 535, a drive validation circuit 540, a logic 545, an inverter 550, or any combination thereof. Each of these components may communicate, directly or indirectly, with one another (e.g., via one or more buses).

The command receiver 525 may be configured as or otherwise support a means for receiving, over a bus, a first request for data, the first request for data including an error, where a first signal of a first type including invalid data and a first signal of a second type result on the bus based at least in part on the first request including the error, the first signal of the second type indicating that the first signal of the first type is associated with one or more errors. In some examples, the command receiver 525 may be configured as or otherwise support a means for receiving, over the bus, a second request for the data based at least in part on the first signal of the second type resulting on the bus. The transmitter 530 may be configured as or otherwise support a means for transmitting, over the bus based at least in part on receiving the second request, a second signal of the first type including the data and the second signal of the second type including an indication of whether the second signal of the first type is associated with one or more errors.

In some examples, the syndrome check circuit 535 may be configured as or otherwise support a means for generating, within a memory die, a third signal that indicates whether the data includes one or more errors based at least in part on a successful reception of the second request. In some examples, the drive validation circuit 540 may be configured as or otherwise support a means for generating, within the memory die, a fourth signal that indicates that the bus is in an active state based at least in part on the successful reception of the second request. In some examples, the logic 545 may be configured as or otherwise support a means for applying the third signal and the fourth signal to logic that outputs a third signal of the second type having a first logic value when one or both of the third signal and the fourth signal have the first logic value or having a second logic value when both the third signal and the fourth signal have the second logic value, where the second signal of the second type is based at least in part on the third signal of the second type.

In some examples, the syndrome check circuit 535 may be configured as or otherwise support a means for generating, within a memory die, a third signal of the second type having a second logic value based at least in part on a successful reception of the second request, where the third signal of the second type indicates that the second signal of the first type is associated with one or more errors based at least in part on having the second logic value. In some examples, the inverter 550 may be configured as or otherwise support a means for inverting, external to the memory die, the third signal of the second type to obtain the second signal of the second type having a first logic value, where the second signal of the second type indicates that that the second signal of the first type is associated with one or more errors based at least in part on having the first logic value.

In some examples, the bus enters or remains in an idle state based at least in part on the second request including the error, and the first signal of the second type has the first logic value based at least in part on the bus entering or remaining in the idle state.

In some examples, the syndrome check circuit 535 may be configured as or otherwise support a means for generating, within a memory die, a third signal of the second type having a first logic value based at least in part on a successful reception of the second request, where the third signal of the second type indicates that the second signal of the first type is associated with no errors based at least in part on having the first logic value. In some examples, the inverter 550 may be configured as or otherwise support a means for inverting, external to the memory die, the third signal of the second type to obtain the second signal of the second type having a second logic value, where the second signal of the second type indicates that the second signal of the first type is associated with no errors based at least in part on having the second logic value.

In some examples, a first logic value for a signal of the second type indicates that a corresponding signal of the first type is associated with one or more errors and a second logic value for the signal of the second type indicates that the corresponding signal of the first type is associated with no errors, and the first signal of the second type that results on the bus has the first logic value.

In some examples, signals of the first type are associated with communicating data and signals of the second type are associated with indicating whether a corresponding signal of the first type is associated with one or more errors.

In some examples, signals of the second type include syndrome check signals, inverted syndrome check signals, master error signals, inverted master error signals, or any combination thereof.

Figure 6:
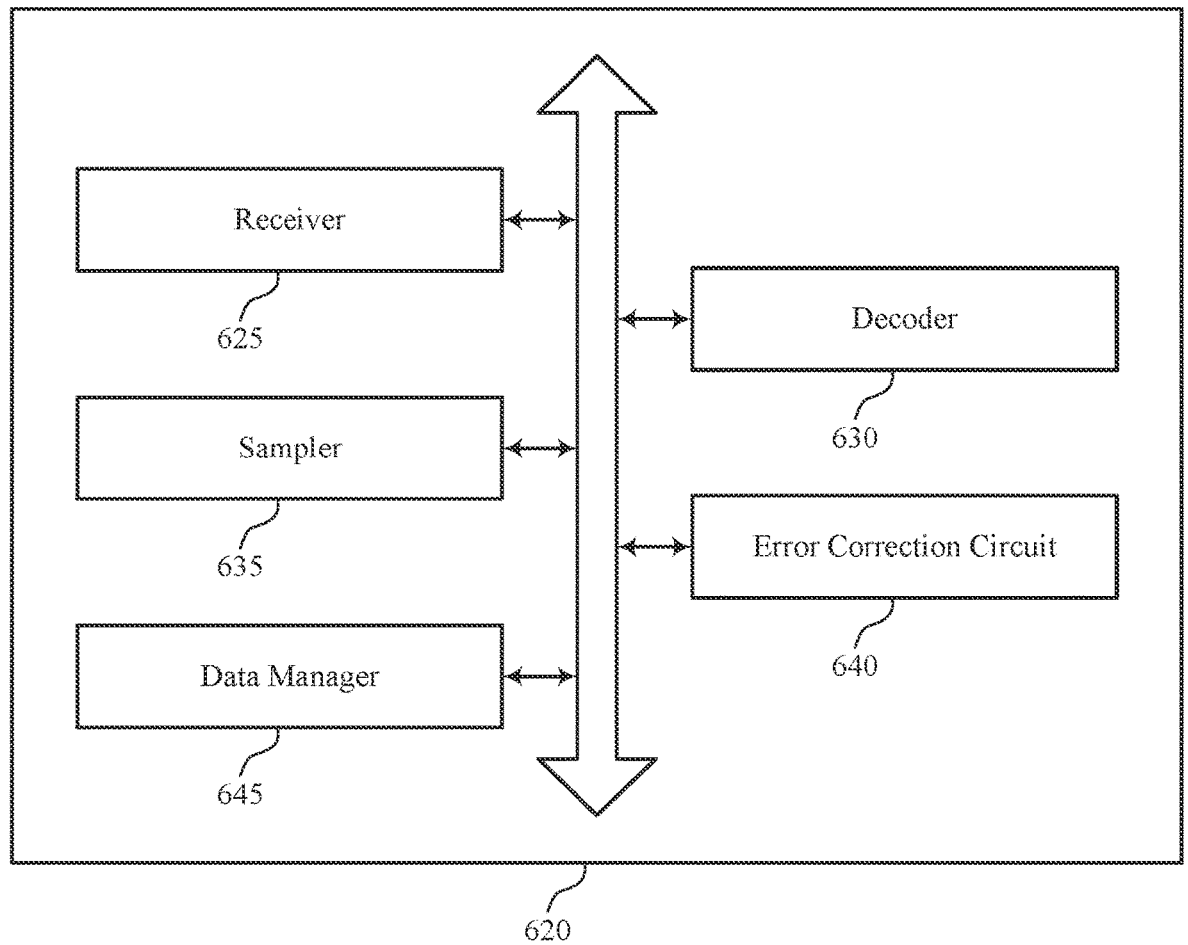
FIG. 6 shows a block diagram of a host device that supports techniques for detecting a state of a bus in accordance with examples as disclosed herein.

FIG. 6 shows a block diagram 600 of a host device 620 that supports techniques for detecting a state of a bus in accordance with examples as disclosed herein. The host device 620 may be an example of aspects of a host device as described with reference to FIGS. 1 through 4. The host device 620, or various components thereof, may be an example of means for performing various aspects of techniques for detecting a state of a bus as described herein. For example, the host device 620 may include a receiver 625, a decoder 630, a sampler 635, an error correction circuit 640, a data manager 645, or any combination thereof. Each of these components may communicate, directly or indirectly, with one another (e.g., via one or more buses).

The receiver 625 may be configured as or otherwise support a means for receiving, over a bus in an idle state, a signal of a first type including invalid data and a signal of a second type including an indication that the signal of the first type is associated with one or more errors. The decoder 630 may be configured as or otherwise support a means for decoding the signal of the second type based at least in part on the receiving. In some examples, the decoder 630 may be configured as or otherwise support a means for decoding the signal of the first type based at least in part on determining, from decoding the signal of the second type, that the signal of the first type is associated with one or more errors.

In some examples, the decoder 630 may be configured as or otherwise support a means for determining that the signal of the second type has a first logic value based at least in part on decoding the signal of the second type, where the signal of the first type is determined as being associated with one or more errors based at least in part on the signal of the second type having the first logic value.

In some examples, to support decoding the signal of the first type, the error correction circuit 640 may be configured as or otherwise support a means for attempting to correct one or more errors in the signal of the first type based at least in part on the signal of the second type having the first logic value.

In some examples, the data manager 645 may be configured as or otherwise support a means for discarding the invalid data obtained from decoding the signal of the first type based at least in part on failing to correct the one or more errors in the signal of the first type.

In some examples, the receiver 625 may be configured as or otherwise support a means for receiving, over the bus while the bus is in an active state, a second signal of the first type and a second signal of the second type. In some examples, the decoder 630 may be configured as or otherwise support a means for decoding, while the bus is in the active state, the second signal of the first type and the second signal of the second type, the second signal of the first type being decoded based at least in part on determining, from decoding the signal of the second type, whether the second signal of the second type has a first logic value or a second logic value.

In some examples, the second signal of the second type indicates that the signal of the first type is associated with one or more errors based at least in part on having the first logic value, and the second signal of the second type indicates that the signal of the first type is associated with no errors based at least in part on having the second logic value.

In some examples, the data manager 645 may be configured as or otherwise support a means for using data obtained from decoding the second signal of the first type based at least in part on determining that the second signal of the second type has the second logic value.

In some examples, receiving the signal of the first type includes sampling a first plurality of lines of the bus for communicating data. In some examples, receiving the signal of the second type includes sampling a line of the bus for communicating indications of whether signals of the first type are associated with one or more errors.

In some examples, signals of the first type are associated with communicating data and signals of the second type are associated with indicating whether a corresponding signal of the first type is associated with one or more errors.

In some examples, one or more transmission lines of the bus are in a floating state when the bus is in the idle state.

Figure 7:
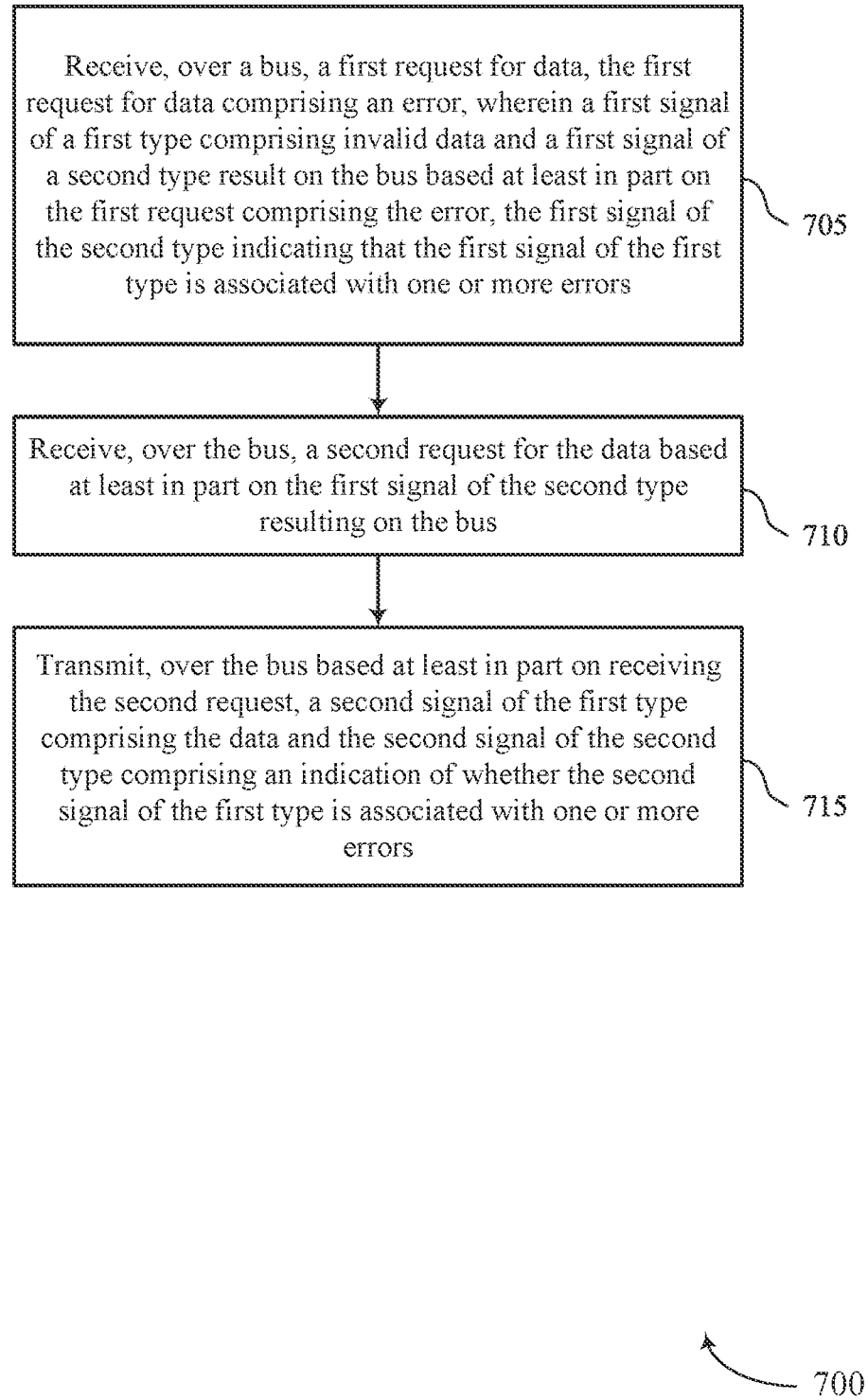
FIGS. 7 through 9 show flowcharts illustrating a method or methods that support techniques for detecting a state of a bus in accordance with examples as disclosed herein.

FIG. 7 shows a flowchart illustrating a method 700 that supports techniques for detecting a state of a bus in accordance with examples as disclosed herein. The operations of method 700 may be implemented by a memory device or its components as described herein. For example, the operations of method 700 may be performed by a memory device as described with reference to FIGS. 1 through 5. In some examples, a memory device may execute a set of instructions to control the functional elements of the device to perform the described functions. Additionally, or alternatively, the memory device may perform aspects of the described functions using special-purpose hardware.

At 705, the method may include receiving, over a bus, a first request for data, the first request for data including an error, where a first signal of a first type including invalid data and a first signal of a second type result on the bus based at least in part on the first request including the error, the first signal of the second type indicating that the first signal of the first type is associated with one or more errors. The operations of 705 may be performed in accordance with examples as disclosed with herein and reference to FIGS. 3 and 4. In some examples, aspects of the operations of 705 may be performed by a command receiver 525 as described with reference to FIG. 5.

At 710, the method may include receiving, over the bus, a second request for the data based at least in part on the first signal of the second type resulting on the bus. The operations of 710 may be performed in accordance with examples as disclosed with herein and reference to FIGS. 3 and 4. In some examples, aspects of the operations of 710 may be performed by a command receiver 525 as described with reference to FIG. 5.

At 715, the method may include transmitting, over the bus based at least in part on receiving the second request, a second signal of the first type including the data and the second signal of the second type including an indication of whether the second signal of the first type is associated with one or more errors. The operations of 715 may be performed in accordance with examples as disclosed with herein and reference to FIGS. 3 and 4. In some examples, aspects of the operations of 715 may be performed by a transmitter 530 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor) for receiving, over a bus, a first request for data, the first request for data including an error, where a first signal of a first type including invalid data and a first signal of a second type result on the bus based at least in part on the first request including the error, the first signal of the second type indicating that the first signal of the first type is associated with one or more errors, receiving, over the bus, a second request for the data based at least in part on the first signal of the second type resulting on the bus, and transmitting, over the bus based at least in part on receiving the second request, a second signal of the first type including the data and the second signal of the second type including an indication of whether the second signal of the first type is associated with one or more errors.

In some examples of the method 700 and the apparatus described herein, generating, within a memory die, a third signal that indicates whether the data includes one or more errors based at least in part on a successful reception of the second request, generating, within the memory die, a fourth signal that indicates that the bus may be in an active state based at least in part on the successful reception of the second request, and applying the third signal and the fourth signal to logic that outputs a third signal of the second type having a first logic value when one or both of the third signal and the fourth signal may have the first logic value or having a second logic value when both the third signal and the fourth signal may have the second logic value, where the second signal of the second type may be based at least in part on the third signal of the second type.

In some examples of the method 700 and the apparatus described herein, generating, within a memory die, a third signal of the second type having a second logic value based at least in part on a successful reception of the second request, where the third signal of the second type indicates that the second signal of the first type may be associated with one or more errors based at least in part on having the second logic value and inverting, external to the memory die, the third signal of the second type to obtain the second signal of the second type having a first logic value, where the second signal of the second type indicates that that the second signal of the first type may be associated with one or more errors based at least in part on having the first logic value.

In some examples of the method 700 and the apparatus described herein, the bus enters or remains in an idle state based at least in part on the second request including the error, and the first signal of the second type may have the first logic value based at least in part on the bus entering or remaining in the idle state.

In some examples of the method 700 and the apparatus described herein, generating, within a memory die, a third signal of the second type having a first logic value based at least in part on a successful reception of the second request, where the third signal of the second type indicates that the second signal of the first type may be associated with no errors based at least in part on having the first logic value and inverting, external to the memory die, the third signal of the second type to obtain the second signal of the second type having a second logic value, where the second signal of the second type indicates that the second signal of the first type may be associated with no errors based at least in part on having the second logic value.

In some examples of the method 700 and the apparatus described herein, a first logic value for a signal of the second type indicates that a corresponding signal of the first type may be associated with one or more errors and a second logic value for the signal of the second type indicates that the corresponding signal of the first type may be associated with no errors, and the first signal of the second type that results on the bus may have the first logic value.

In some examples of the method 700 and the apparatus described herein, signals of the first type may be associated with communicating data and signals of the second type may be associated with indicating whether a corresponding signal of the first type may be associated with one or more errors.

In some examples of the method 700 and the apparatus described herein, signals of the second type include syndrome check signals, inverted syndrome check signals, master error signals, inverted master error signals, or any combination thereof.

Figure 8:
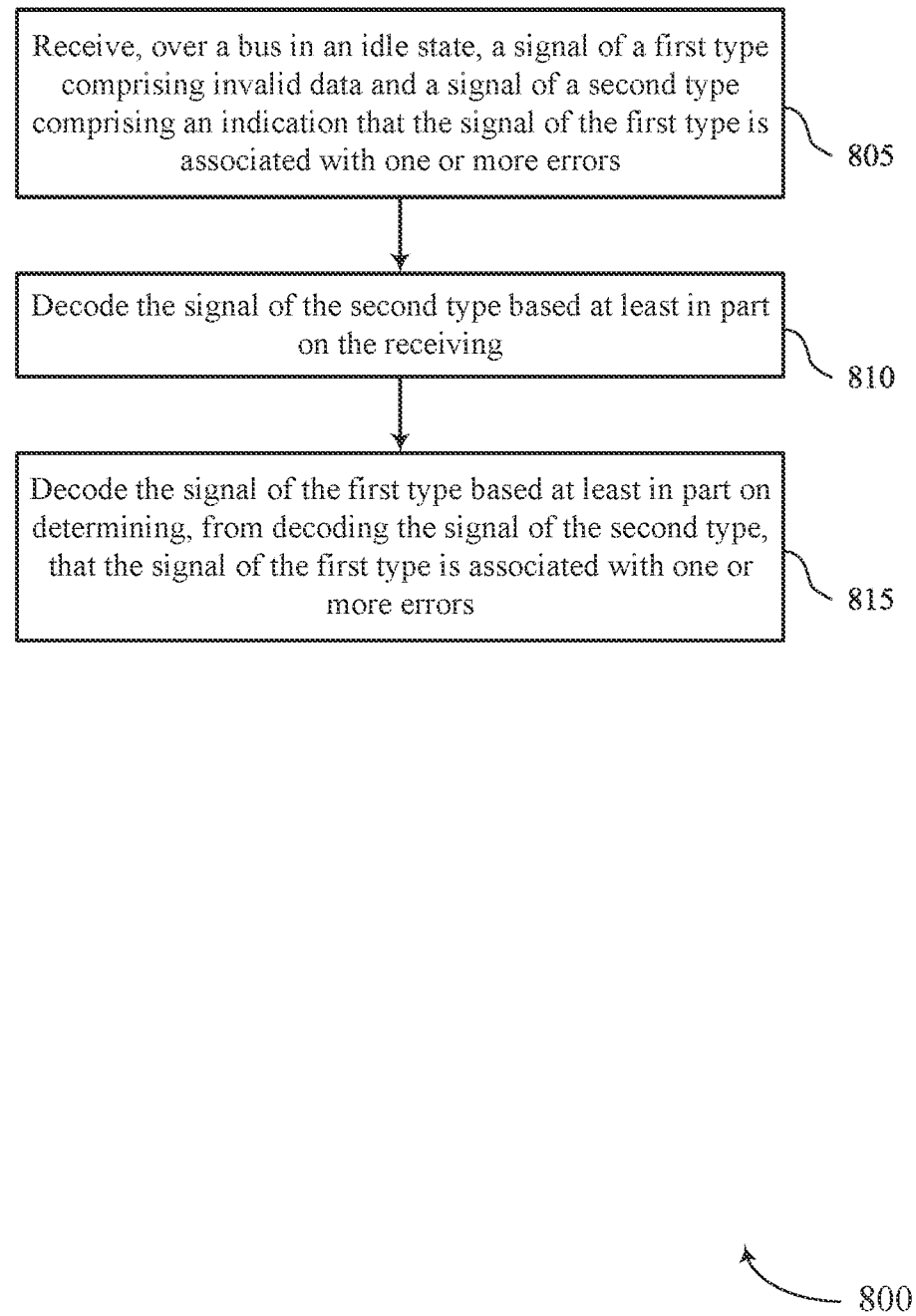

FIG. 8 shows a flowchart illustrating a method 800 that supports techniques for detecting a state of a bus in accordance with examples as disclosed herein. The operations of method 800 may be implemented by a host device or its components as described herein. For example, the operations of method 800 may be performed by a host device as described with reference to FIGS. 1 through 4 and 6. In some examples, a host device may execute a set of instructions to control the functional elements of the device to perform the described functions. Additionally, or alternatively, the host device may perform aspects of the described functions using special-purpose hardware.

At 805, the method may include receiving, over a bus in an idle state, a signal of a first type including invalid data and a signal of a second type including an indication that the signal of the first type is associated with one or more errors. The operations of 805 may be performed in accordance with examples as disclosed with herein and reference to FIGS. 3 and 4. In some examples, aspects of the operations of 805 may be performed by a receiver 625 as described with reference to FIG. 6.

At 810, the method may include decoding the signal of the second type based at least in part on the receiving. The operations of 810 may be performed in accordance with examples as disclosed with herein and reference to FIGS. 3 and 4. In some examples, aspects of the operations of 810 may be performed by a decoder 630 as described with reference to FIG. 6.

At 815, the method may include decoding the signal of the first type based at least in part on determining, from decoding the signal of the second type, that the signal of the first type is associated with one or more errors. The operations of 815 may be performed in accordance with examples as disclosed with herein and reference to FIGS. 3 and 4. In some examples, aspects of the operations of 815 may be performed by a decoder 630 as described with reference to FIG. 6.

In some examples, an apparatus as described herein may perform a method or methods, such as the method 800. The apparatus may include, features, circuitry, logic, means, or instructions (e.g., a non-transitory computer-readable medium storing instructions executable by a processor) for receiving, over a bus in an idle state, a signal of a first type including invalid data and a signal of a second type including an indication that the signal of the first type is associated with one or more errors, decoding the signal of the second type based at least in part on the receiving, and decoding the signal of the first type based at least in part on determining, from decoding the signal of the second type, that the signal of the first type is associated with one or more errors.

Some examples of the method 800 and the apparatus described herein may further include operations, features, circuitry, logic, means, or instructions for determining that the signal of the second type may have a first logic value based at least in part on decoding the signal of the second type, where the signal of the first type may be determined as being associated with one or more errors based at least in part on the signal of the second type having the first logic value.

In some examples of the method 800 and the apparatus described herein, decoding the signal of the first type may include operations, features, circuitry, logic, means, or instructions for attempting to correct one or more errors in the signal of the first type based at least in part on the signal of the second type having the first logic value.

Some examples of the method 800 and the apparatus described herein may further include operations, features, circuitry, logic, means, or instructions for discarding the invalid data obtained from decoding the signal of the first type based at least in part on failing to correct the one or more errors in the signal of the first type.

Some examples of the method 800 and the apparatus described herein may further include operations, features, circuitry, logic, means, or instructions for receiving, over the bus while the bus may be in an active state, a second signal of the first type and a second signal of the second type and decoding, while the bus may be in the active state, the second signal of the first type and the second signal of the second type, the second signal of the first type being decoded based at least in part on determining, from decoding the signal of the second type, whether the second signal of the second type may have a first logic value or a second logic value.

In some examples of the method 800 and the apparatus described herein, the second signal of the second type indicates that the signal of the first type may be associated with one or more errors based at least in part on having the first logic value, and the second signal of the second type indicates that the signal of the first type may be associated with no errors based at least in part on having the second logic value.

Some examples of the method 800 and the apparatus described herein may further include operations, features, circuitry, logic, means, or instructions for using data obtained from decoding the second signal of the first type based at least in part on determining that the second signal of the second type may have the second logic value.

Some examples of the method 800 and the apparatus described herein may further include operations, features, circuitry, logic, means, or instructions for receiving the signal of the first type includes sampling a first plurality of lines of the bus for communicating data and receiving the signal of the second type includes sampling a line of the bus for communicating indications of whether signals of the first type may be associated with one or more errors.

In some examples of the method 800 and the apparatus described herein, signals of the first type may be associated with communicating data and signals of the second type may be associated with indicating whether a corresponding signal of the first type may be associated with one or more errors.

In some examples of the method 800 and the apparatus described herein, one or more transmission lines of the bus may be in a floating state when the bus may be in the idle state.

Figure 9:
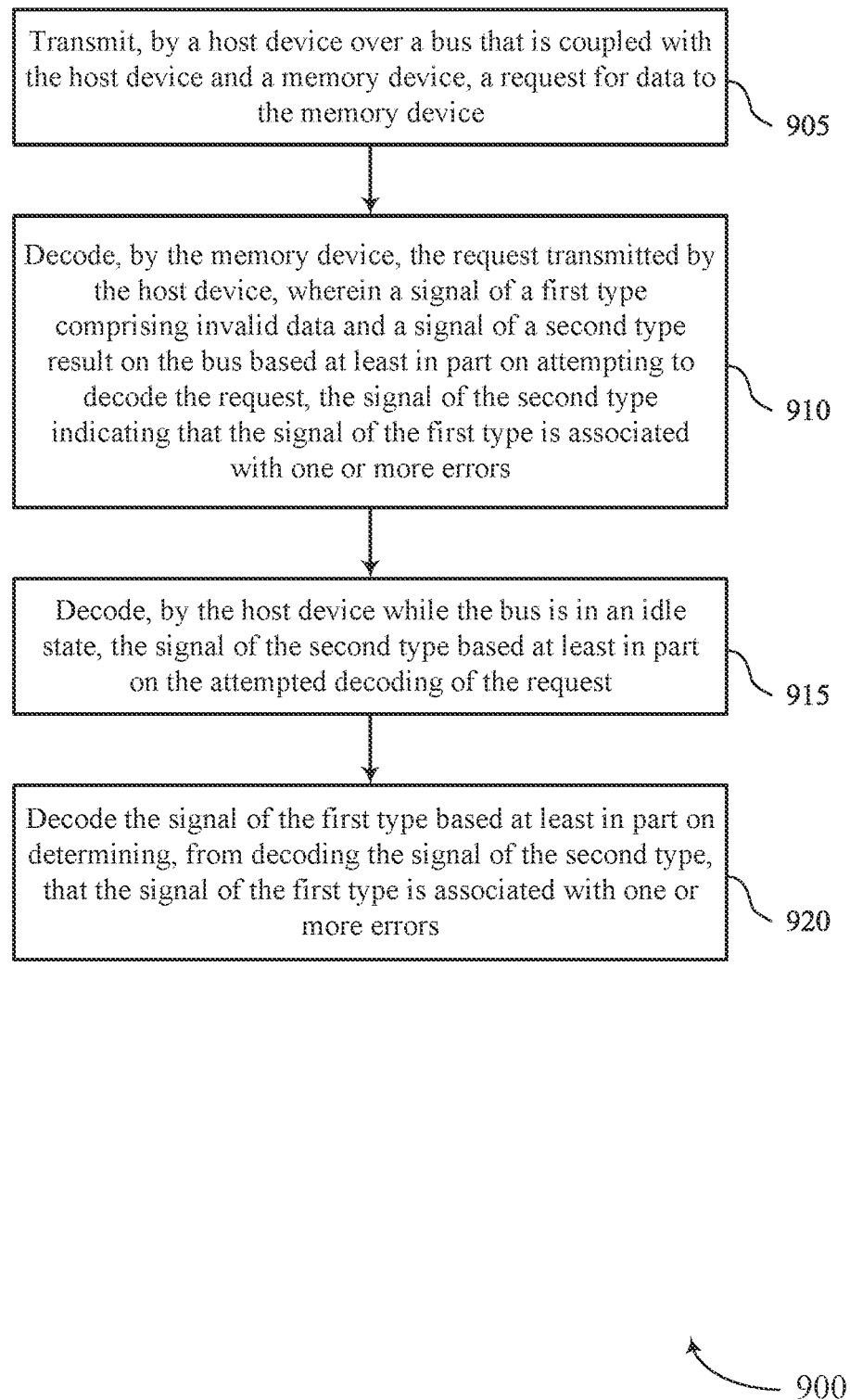

FIG. 9 shows a flowchart illustrating a method 900 that supports techniques for detecting a state of a bus in accordance with examples as disclosed herein. The operations of method 900 may be implemented by a system or its components as described herein. For example, the operations of method 900 may be performed by a system as described with reference to FIGS. 1 through 4. In some examples, a system may execute a set of instructions to control the functional elements of the device to perform the described functions. Additionally, or alternatively, the system may perform aspects of the described functions using special-purpose hardware.

At 905, the method may include transmitting, by a host device over a bus that is coupled with the host device and a memory device, a request for data to the memory device. The operations of 905 may be performed in accordance with examples as disclosed with herein and reference to FIGS. 3 and 4. In some examples, aspects of the operations of 905 may be performed by a host device transmitter.

At 910, the method may include decoding, by the memory device, the request transmitted by the host device, where a signal of a first type including invalid data and a signal of a second type result on the bus based at least in part on attempting to decode the request, the signal of the second type indicating that the signal of the first type is associated with one or more errors. The operations of 910 may be performed in accordance with examples as disclosed with herein and reference to FIGS. 3 and 4. In some examples, aspects of the operations of 910 may be performed by a memory device decoder.

At 915, the method may include decoding, by the host device while the bus is in an idle state, the signal of the second type based at least in part on the attempted decoding of the request. The operations of 915 may be performed in accordance with examples as disclosed with herein and reference to FIGS. 3 and 4. In some examples, aspects of the operations of 915 may be performed by a host decoder.

At 920, the method may include decoding the signal of the first type based at least in part on determining, from decoding the signal of the second type, that the signal of the first type is associated with one or more errors. The operations of 920 may be performed in accordance with examples as disclosed with herein and reference to FIGS. 3 and 4. In some examples, aspects of the operations of 920 may be performed by a host decoder.

In some examples, an apparatus as described herein may perform a method or methods, such as the method 900. The apparatus may include, features, circuitry, logic, means, or instructions (e.g., a non-transitory computer-readable medium storing instructions executable by a processor) for transmitting, by a host device over a bus that is coupled with the host device and a memory device, a request for data to the memory device, decoding, by the memory device, the request transmitted by the host device, where a signal of a first type including invalid data and a signal of a second type result on the bus based at least in part on attempting to decode the request, the signal of the second type indicating that the signal of the first type is associated with one or more errors, decoding, by the host device while the bus is in an idle state, the signal of the second type based at least in part on the attempted decoding of the request, and decoding the signal of the first type based at least in part on determining, from decoding the signal of the second type, that the signal of the first type is associated with one or more errors.

In some examples of the method 900 and the apparatus described herein, and the method, apparatuses, and non-transitory computer-readable medium may include further operations, features, circuitry, logic, means, or instructions for discarding, by the host device, the invalid data obtained from decoding the signal of the first type based at least in part on failing to correct the one or more errors in the signal of the first type.

Some examples of the method 900 and the apparatus described herein may further include operations, features, circuitry, logic, means, or instructions for transmitting, by the host device over the bus, a second request for the data to the memory device, decoding, by the memory device, the second request transmitted by the host device, transmitting, by the memory device over the bus, a second signal of the first type and a second signal of the second type based at least in part on a successful decoding of the second request, decoding, by the host device, the second signal of the second type while the bus may be in an active state, and determining, by the host device based at least in part on decoding the second signal of the second type, whether the second signal of the first type may be associated with one or more errors.

Some examples of the method 900 and the apparatus described herein may further include operations, features, circuitry, logic, means, or instructions for decoding the second signal of the first type, where decoding the second signal of the first type includes attempting to correct the one or more errors in second data obtained from decoding the second signal of the first type based at least in part on determining that the second signal of the first type may be associated with one or more errors and using the second data obtained from decoding the second signal of the first type based at least in part on correcting the one or more errors in the second data obtained from decoding the second signal of the first type.

In some examples of the method 900 and the apparatus described herein, a read operation may be not performed at the memory device based at least in part on attempting to decode the request.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a memory array, a controller coupled with the memory array and configured to transmit, over a bus that is coupled with the memory array, a signal of a first type for communicating data based at least in part on a request for data in the memory array, a circuit coupled with the memory array and the controller, the circuit configured to set a signal of a second type to a first logic value when the signal of the first type is associated with one or more errors and to a second logic value when the signal of the first type is associated with no errors based at least in part on the request for the data and transmit, over the bus, the signal of the second type based at least in part on setting the signal of the second type to the first logic value or the second logic value, and a pin coupled with the circuit and the bus, where the pin is configured to have the first logic value when the bus is in an idle state.

In some examples of the apparatus, the circuit includes a second circuit configured to generate a third signal that indicates whether the data includes one or more errors based at least in part on a successful reception of the second request, a third circuit configured to generate a fourth signal that indicates that the bus may be in an active state based at least in part on the successful reception of the second request, and logic configured to receive the third signal and the fourth signal and output a third signal of the second type having a first logic value when one or both of the third signal and the fourth signal may have the first logic value or having a second logic value when both the third signal and the fourth signal may have the second logic value, where the second signal of the second type may be based at least in part on the third signal of the second type.

In some examples of the apparatus, the circuit includes a first circuit configured to generate a third signal of the second type and an inverter coupled with the first circuit and configured to invert the third signal of the second type to obtain the signal of the second type that may be transmitted over the bus.

In some examples of the apparatus, the bus includes a plurality of transmission lines coupled with the controller and associated with communicating data, a transmission line coupled with the pin and associated with communicating indications of whether signals of the first type may be associated with one or more errors, and a voltage source coupled with the plurality of transmission lines and the transmission line, the voltage source having a voltage corresponding to the first logic value.

In some examples of the apparatus, a memory die that includes the memory array, the controller, and the circuit and a package for accessing the memory die that includes the pin.

In some examples of the apparatus, the circuit may be a syndrome check circuit that may be configured to detect whether the data included in the signal of the first type may be associated with one or more errors.

Another apparatus is described. The apparatus may include a memory array and a controller coupled with the memory array and configured to cause the apparatus to receive, over a bus, a first request for data, the first request for data including an error, where a first signal of a first type including invalid data and a first signal of a second type result on the bus based at least in part on the first request including the error, the first signal of the second type indicating that the first signal of the first type is associated with one or more errors, receive, over the bus, a second request for the data based at least in part on the first signal of the second type resulting on the bus, and transmit, over the bus based at least in part on receiving the second request, a second signal of the first type including the data and the second signal of a second type including an indication of whether the second signal of the first type is associated with one or more errors.

In some examples of the apparatus, the controller may be further configured to cause the apparatus to generate, within a memory die, a third signal of the second type having a second logic value based at least in part on a successful reception of the second request, where the third signal of the second type indicates that the second signal of the first type may be associated with one or more errors based at least in part on having the second logic value and invert, external to the memory die, the third signal of the second type to obtain the second signal of the second type having a first logic value, where the second signal of the second type indicates that that the second signal of the first type may be associated with one or more errors based at least in part on having the first logic value.

In some examples of the apparatus, the controller may be further configured to cause the apparatus to generate, within a memory die, a third signal of the second type having a first logic value based at least in part on a successful reception of the second request, where the third signal of the second type indicates that the second signal of the first type may be associated with no errors based at least in part on having the first logic value and invert, external to the memory die, the third signal of the second type to obtain the second signal of the second type having a second logic value, where the second signal of the second type indicates that the second signal of the first type may be associated with no errors based at least in part on having the second logic value.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, over a bus, a first request for data, the first request for data comprising an error, wherein a first signal of a first type comprising invalid data and a first signal of a second type result on the bus based at least in part on the first request comprising the error, the first signal of the second type different from the first signal of the first type and indicating that the first signal of the first type is associated with one or more errors;
   receiving, over the bus, a second request for the data based at least in part on the first signal of the second type resulting on the bus; and
   transmitting, over the bus based at least in part on receiving the second request, a second signal of the first type comprising the data and a second signal of the second type, the second signal of the second type different from the second signal of the first type and indicating whether the second signal of the first type is associated with one or more errors.

2. The method of claim 1, further comprising:
   generating, within a memory die, a third signal that indicates whether the data includes one or more errors based at least in part on a successful reception of the second request;
   generating, within the memory die, a fourth signal that indicates that the bus is in an active state based at least in part on the successful reception of the second request; and
   applying the third signal and the fourth signal to logic that outputs a third signal of the second type having a first logic value when one or both of the third signal and the fourth signal have the first logic value or having a second logic value when both the third signal and the fourth signal have the second logic value, wherein the second signal of the second type is based at least in part on the third signal of the second type.

3. The method of claim 1, further comprising:
   generating, within a memory die, a third signal of the second type having a second logic value based at least in part on a successful reception of the second request, wherein the third signal of the second type indicates that the second signal of the first type is associated with one or more errors based at least in part on having the second logic value; and
   inverting, external to the memory die, the third signal of the second type to obtain the second signal of the second type having a first logic value, wherein the second signal of the second type indicates that that the second signal of the first type is associated with one or more errors based at least in part on having the first logic value.

4. The method of claim 3, wherein:
   the bus enters or remains in an idle state based at least in part on the second request comprising the error, and
   the first signal of the second type has the first logic value based at least in part on the bus entering or remaining in the idle state.

5. The method of claim 1, further comprising:
   generating, within a memory die, a third signal of the second type having a first logic value based at least in part on a successful reception of the second request, wherein the third signal of the second type indicates that the second signal of the first type is associated with no errors based at least in part on having the first logic value; and
   inverting, external to the memory die, the third signal of the second type to obtain the second signal of the second type having a second logic value, wherein the second signal of the second type indicates that the second signal of the first type is associated with no errors based at least in part on having the second logic value.

6. The method of claim 1, wherein:
   a first logic value for a signal of the second type indicates that a corresponding signal of the first type is associated with one or more errors and a second logic value for the signal of the second type indicates that the corresponding signal of the first type is associated with no errors, and
   the first signal of the second type that results on the bus has the first logic value.

7. The method of claim 1, wherein signals of the first type are associated with communicating data and signals of the second type are associated with indicating whether a corresponding signal of the first type is associated with one or more errors.

8. The method of claim 1, wherein signals of the second type comprise syndrome check signals, inverted syndrome check signals, master error signals, inverted master error signals, read data strobe signals, or any combination thereof.

9. The method of claim 1, wherein the invalid data comprises random data or unknown data.

10. A method, comprising:
    receiving, over a bus in an idle state, a signal of a first type comprising invalid data and a signal of a second type comprising an indication that the signal of the first type is associated with one or more errors, the signal of the second type different from the signal of the first type;

decoding the signal of the second type based at least in part on the receiving; and decoding the signal of the first type based at least in part on determining, from decoding the signal of the second type, that the signal of the first type is associated with one or more errors.

11. The method of claim 10, further comprising:

determining that the signal of the second type has a first logic value based at least in part on decoding the signal of the second type, wherein the signal of the first type is determined as being associated with one or more errors based at least in part on the signal of the second type having the first logic value.

12. The method of claim 11, wherein decoding the signal of the first type comprises:

attempting to correct one or more errors in the signal of the first type based at least in part on the signal of the second type having the first logic value.

13. The method of claim 11, further comprising:

discarding the invalid data obtained from decoding the signal of the first type based at least in part on failing to correct the one or more errors in the signal of the first type.

14. The method of claim 10, further comprising:

receiving, over the bus while the bus is in an active state, a second signal of the first type and a second signal of the second type; and decoding, while the bus is in the active state, the second signal of the first type and the second signal of the second type, the second signal of the first type being decoded based at least in part on determining, from decoding the signal of the second type, whether the second signal of the second type has a first logic value or a second logic value.

15. The method of claim 14, wherein:

the second signal of the second type indicates that the signal of the first type is associated with one or more errors based at least in part on having the first logic value, and the second signal of the second type indicates that the signal of the first type is associated with no errors based at least in part on having the second logic value.

16. The method of claim 14, further comprising:

using data obtained from decoding the second signal of the first type based at least in part on determining that the second signal of the second type has the second logic value.

17. The method of claim 10, wherein:

receiving the signal of the first type comprises sampling a first plurality of lines of the bus for communicating data, and receiving the signal of the second type comprises sampling a line of the bus for communicating indications of whether signals of the first type are associated with one or more errors.

18. The method of claim 10, wherein signals of the first type are associated with communicating data and signals of the second type are associated with indicating whether a corresponding signal of the first type is associated with one or more errors.

19. The method of claim 10, wherein one or more transmission lines of the bus are in a floating state when the bus is in the idle state.

20. An apparatus, comprising:

a memory array;

a controller coupled with the memory array and configured to transmit, over a bus that is coupled with the memory array, a signal of a first type for communicating data based at least in part on a request for data in the memory array;

a circuit coupled with the memory array and the controller, the circuit configured to:

set a signal of a second type to a first logic value when the signal of the first type is associated with one or more errors and to a second logic value when the signal of the first type is associated with no errors based at least in part on the request for the data, wherein the signal of the second type is different from the signal of the first type; and transmit, over the bus, the signal of the second type based at least in part on setting the signal of the second type to the first logic value or the second logic value; and a pin coupled with the circuit and the bus, wherein the pin is configured to have the first logic value when the bus is in an idle state.

21. The apparatus of claim 20, wherein the circuit comprises:

a second circuit configured to generate a third signal that indicates whether the data includes one or more errors based at least in part on a successful reception of a second request for the data;

a third circuit configured to generate a fourth signal that indicates that the bus is in an active state based at least in part on the successful reception of the second request; and logic configured to receive the third signal and the fourth signal and output a third signal of the second type having the first logic value when one or both of the third signal and the fourth signal have the first logic value or having the second logic value when both the third signal and the fourth signal have the second logic value, wherein the signal of the second type is based at least in part on the third signal of the second type.

22. The apparatus of claim 20, wherein the circuit comprises:

a first circuit configured to generate a third signal of the second type; and an inverter coupled with the first circuit and configured to invert the third signal of the second type to obtain the signal of the second type that is transmitted over the bus.

23. The apparatus of claim 20, wherein the bus comprises:

a plurality of transmission lines coupled with the controller and associated with communicating data;

a transmission line coupled with the pin and associated with communicating indications of whether signals of the first type are associated with one or more errors; and a voltage source coupled with the plurality of transmission lines and the transmission line, the voltage source having a voltage corresponding to the first logic value.

24. The apparatus of claim 20, further comprising:

a memory die that comprises the memory array, the controller, and the circuit; and a package for accessing the memory die that comprises the pin.

25. The apparatus of claim 20, wherein the circuit is a syndrome check circuit that is configured to detect whether the data included in the signal of the first type is associated with one or more errors.

26. A method, comprising:
  transmitting, by a host device over a bus that is coupled with the host device and a memory device, a request for data to the memory device;
  decoding, by the memory device, the request transmitted by the host device, wherein a signal of a first type comprising invalid data and a signal of a second type result on the bus based at least in part on attempting to decode the request, the signal of the second type different from the signal of the first type and indicating that the signal of the first type is associated with one or more errors;
  decoding, by the host device while the bus is in an idle state, the signal of the second type based at least in part on the attempted decoding of the request; and
  decoding the signal of the first type based at least in part on determining, from decoding the signal of the second type, that the signal of the first type is associated with one or more errors.

27. The method of claim 26, wherein decoding the signal of the first type comprises attempting to correct the one or more errors in the invalid data obtained from decoding the signal of the first type, the method further comprising:
  discarding, by the host device, the invalid data obtained from decoding the signal of the first type based at least in part on failing to correct the one or more errors in the signal of the first type.

28. The method of claim 26, further comprising:
  transmitting, by the host device over the bus, a second request for the data to the memory device;
  decoding, by the memory device, the second request transmitted by the host device;
  transmitting, by the memory device over the bus, a second signal of the first type and a second signal of the second type based at least in part on a successful decoding of the second request;
  decoding, by the host device, the second signal of the second type while the bus is in an active state; and
  determining, by the host device based at least in part on decoding the second signal of the second type, whether the second signal of the first type is associated with one or more errors.

29. The method of claim 28, further comprising:
  decoding the second signal of the first type, wherein decoding the second signal of the first type comprises attempting to correct the one or more errors in second data obtained from decoding the second signal of the first type based at least in part on determining that the second signal of the first type is associated with one or more errors; and
  using the second data obtained from decoding the second signal of the first type based at least in part on correcting the one or more errors in the second data obtained from decoding the second signal of the first type.

30. The method of claim 26, wherein a read operation is not performed at the memory device based at least in part on attempting to decode the request.

31. An apparatus, comprising:
  a memory array; and
  a controller coupled with the memory array and configured to cause the apparatus to:
    receive, over a bus, a first request for data, the first request for data comprising an error, wherein a first signal of a first type comprising invalid data and a first signal of a second type result on the bus based at least in part on the first request comprising the error, the first signal of the second type different from the first signal of the first type and indicating that the first signal of the first type is associated with one or more errors;
    receive, over the bus, a second request for the data based at least in part on the first signal of the second type resulting on the bus; and
    transmit, over the bus based at least in part on receiving the second request, a second signal of the first type comprising the data and a second signal of a second type, the second signal of the second type different from the second signal of the first type and indicating whether the second signal of the first type is associated with one or more errors.

32. The apparatus of claim 31, wherein the controller is further configured to cause the apparatus to:
  generate, within a memory die, a third signal of the second type having a second logic value based at least in part on a successful reception of the second request, wherein the third signal of the second type indicates that the second signal of the first type is associated with one or more errors based at least in part on having the second logic value; and
  invert, external to the memory die, the third signal of the second type to obtain the second signal of the second type having a first logic value, wherein the second signal of the second type indicates that that the second signal of the first type is associated with one or more errors based at least in part on having the first logic value.

33. The apparatus of claim 31, wherein the controller is further configured to cause the apparatus to:
  generate, within a memory die, a third signal of the second type having a first logic value based at least in part on a successful reception of the second request, wherein the third signal of the second type indicates that the second signal of the first type is associated with no errors based at least in part on having the first logic value; and
  invert, external to the memory die, the third signal of the second type to obtain the second signal of the second type having a second logic value, wherein the second signal of the second type indicates that the second signal of the first type is associated with no errors based at least in part on having the second logic value.

* * * * *